United States Patent
Kagawa et al.

(10) Patent No.: US 10,229,969 B2
(45) Date of Patent: Mar. 12, 2019

(54) POWER SEMICONDUCTOR DEVICE

(71) Applicant: Mitsubishi Electric Corporation, Chiyoda-ku (JP)

(72) Inventors: Yasuhiro Kagawa, Tokyo (JP); Rina Tanaka, Tokyo (JP); Yutaka Fukui, Tokyo (JP); Katsutoshi Sugawara, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 15/569,636

(22) PCT Filed: May 16, 2016

(86) PCT No.: PCT/JP2016/064473
§ 371 (c)(1),
(2) Date: Oct. 26, 2017

(87) PCT Pub. No.: WO2016/199546
PCT Pub. Date: Dec. 15, 2016

(65) Prior Publication Data
US 2018/0358431 A1 Dec. 13, 2018

(30) Foreign Application Priority Data
Jun. 9, 2015 (JP) .................................. 2015-116700

(51) Int. Cl.
*H01L 29/06* (2006.01)
*H01L 29/78* (2006.01)
(Continued)

(52) U.S. Cl.
CPC ...... *H01L 29/0615* (2013.01); *H01L 21/0465* (2013.01); *H01L 29/1045* (2013.01);
(Continued)

(58) Field of Classification Search
CPC ............. H01L 21/0465; H01L 29/0615; H01L 29/1045; H01L 29/1095; H01L 29/66068; H01L 29/7397; H01L 29/7811; H01L 29/7813

See application file for complete search history.

(56) References Cited

U.S. PATENT DOCUMENTS 9,136,322 B2  9/2015  Nakano et al.
9,466,711 B2  10/2016  Momota et al.
(Continued)

FOREIGN PATENT DOCUMENTS

JP  2005-322949 A  11/2005
JP  2009-194065 A  8/2009
(Continued)

OTHER PUBLICATIONS

International Search Report dated Jun. 21, 2016 in PCT/JP2016/064473, filed on May 16, 2016.

*Primary Examiner* — Allan R Wilson
(74) *Attorney, Agent, or Firm* — Oblon, McClelland, Maier & Neustadt, L.L.P.

(57) ABSTRACT

A protective diffusion region includes a first protective diffusion region at a location closest to a termination region, and a second protective diffusion region located away from the first protective diffusion region with a first space therebetween. A second space that is a distance between a termination diffusion region and the first protective diffusion region is greater than the first space. A current diffusion layer of a first conductivity type includes a first current diffusion layer located between the first protective diffusion region and the second protective diffusion region and having a higher impurity concentration than a drift layer, and a second current diffusion layer located between the first protective diffusion region and the termination diffusion region. The second current diffusion layer includes a region having a lower impurity concentration than the current diffusion layer.

11 Claims, 26 Drawing Sheets

(51) Int. Cl.
  *H01L 29/739* (2006.01)
  *H01L 29/10* (2006.01)
  *H01L 21/04* (2006.01)
  *H01L 29/66* (2006.01)
  *H01L 29/16* (2006.01)
  *H01L 29/20* (2006.01)

(52) U.S. Cl.
  CPC .... *H01L 29/1095* (2013.01); *H01L 29/66068* (2013.01); *H01L 29/7397* (2013.01); *H01L 29/7811* (2013.01); *H01L 29/7813* (2013.01); H01L 21/049 (2013.01); H01L 21/0485 (2013.01); H01L 29/1602 (2013.01); H01L 29/1608 (2013.01); H01L 29/2003 (2013.01)

(56) References Cited

U.S. PATENT DOCUMENTS

| | | | |
|---|---|---|---|
| 9,887,287 B1* | 2/2018 | Lichtenwalner | H01L 27/088 |
| 10,134,593 B2* | 11/2018 | Endo | H01L 21/2003 |
| 2010/0140658 A1* | 6/2010 | Koyama | H01L 27/0664 257/140 |
| 2013/0069109 A1* | 3/2013 | Matsuda | H01L 29/66734 257/139 |
| 2013/0087829 A1* | 4/2013 | Tanabe | H01L 29/66348 257/140 |
| 2013/0221403 A1* | 8/2013 | Lu | H01L 21/761 257/139 |
| 2016/0163849 A1* | 6/2016 | Dupuy | H01L 29/7804 257/334 |
| 2016/0372460 A1 | 12/2016 | Momota et al. | |
| 2018/0040690 A1* | 2/2018 | Kobayashi | H01L 21/0455 |
| 2018/0151366 A1* | 5/2018 | Endo | H01L 21/265 |

FOREIGN PATENT DOCUMENTS

| | | |
|---|---|---|
| JP | 2012-178536 A | 9/2012 |
| JP | 2013-055361 A | 3/2013 |
| JP | 2013-135092 A | 7/2013 |
| WO | 98/35390 | 8/1998 |

* cited by examiner

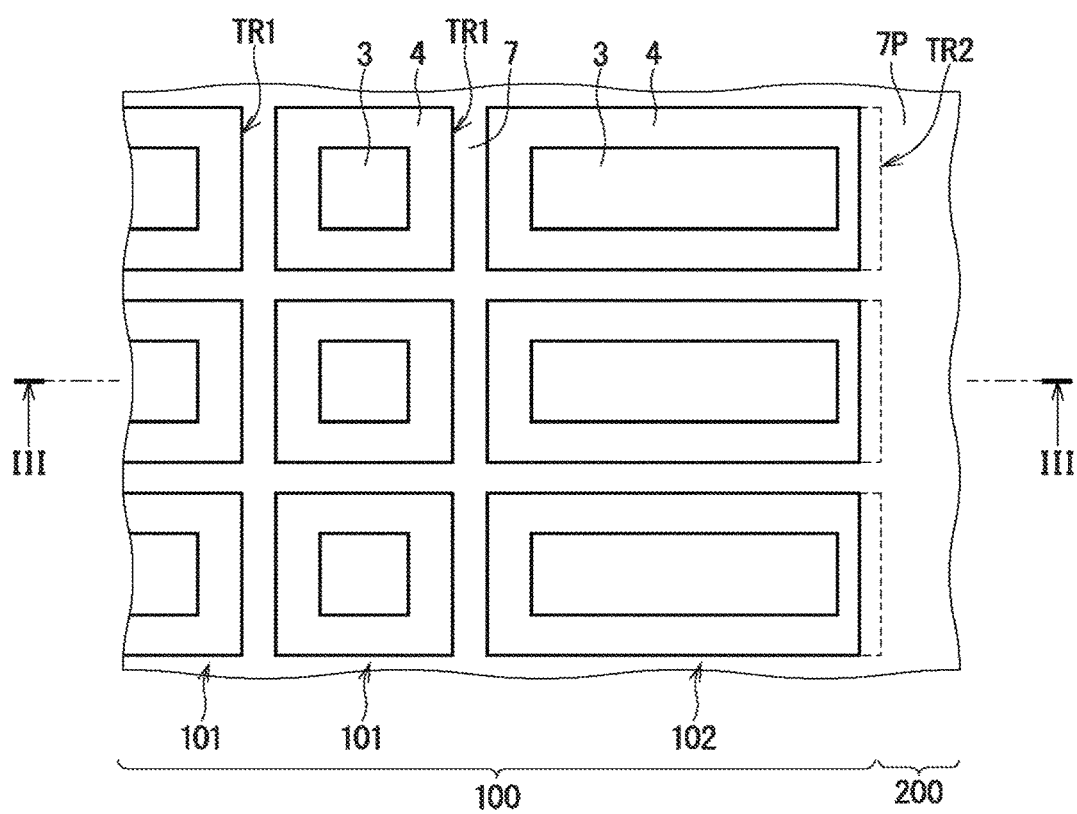
F I G. 2

F I G. 1 2
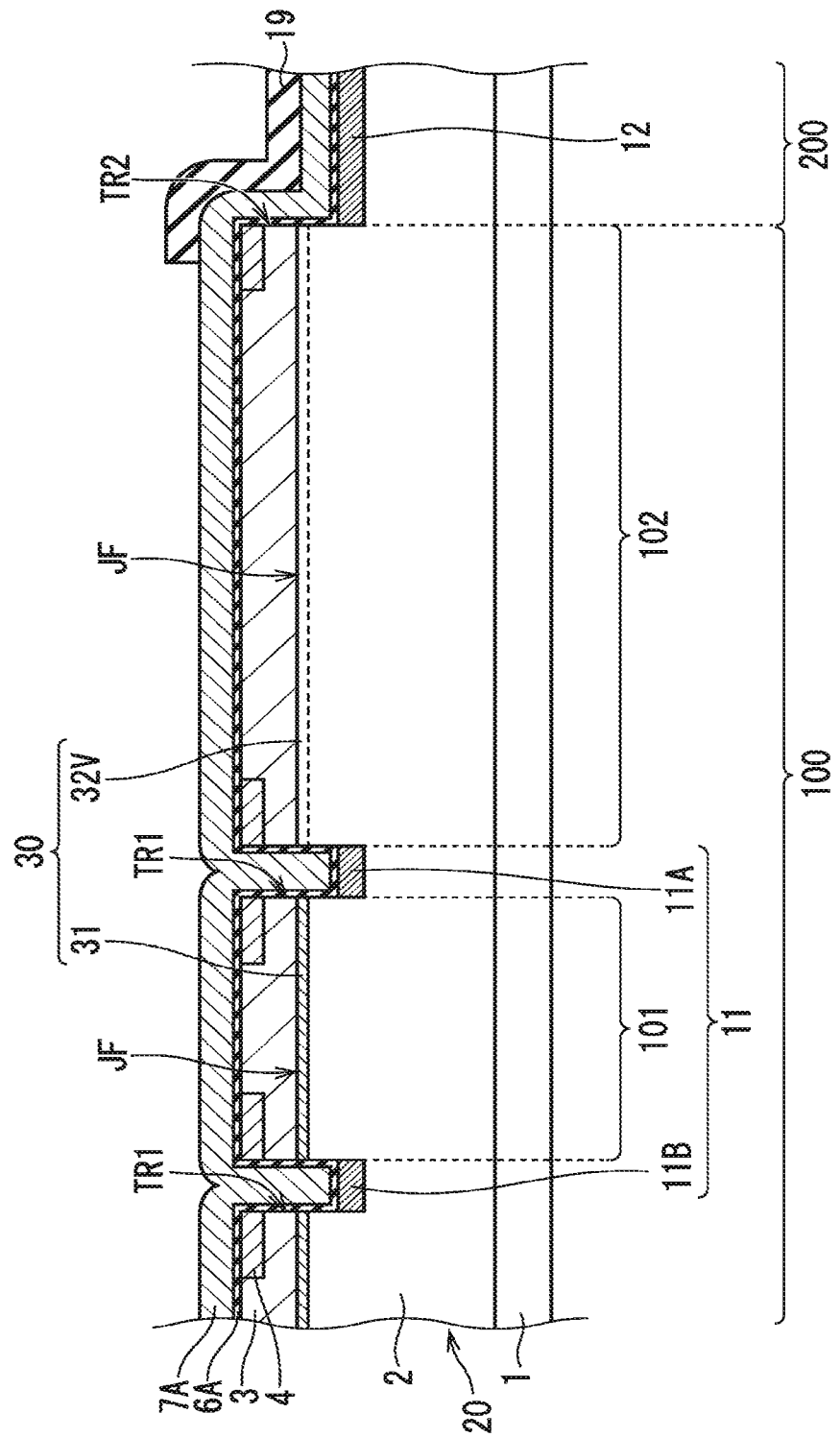

POWER SEMICONDUCTOR DEVICE

TECHNICAL FIELD

The present invention relates to power semiconductor devices, and, in particular, to a trench gate power semiconductor device including a wide bandgap semiconductor.

BACKGROUND ART

Insulated gate power semiconductor devices, such as metal oxide semiconductor field effect transistors (MOSFETs) and insulated gate bipolar transistors (IGBTs), are widely used as semiconductor switching elements. In a typical example thereof, a switching element can be on by applying a voltage equal to or higher than a threshold voltage to a gate electrode to form a channel. Especially in a trench gate power semiconductor device, a semiconductor layer has a trench, and a base region on a side face of the trench is used as the channel. This improves a channel width density, and thus enables reduction in cell pitch to thereby improve device performance.

As a semiconductor material for semiconductor switching elements, a wide bandgap semiconductor has attracted attention in recent years to yield high-voltage, low-loss semiconductor switching elements. The wide bandgap semiconductor shows promise for the application especially in the technical field of using a high voltage of approximately 1 kV or higher. Examples of the wide bandgap semiconductor include, in addition to SiC, a gallium nitride (GaN) material or diamond. In a trench gate silicon carbide semiconductor device including the wide bandgap semiconductor, a gate insulating film, such as a silicon oxide film, is likely to have a breakdown field strength approximately equal to an avalanche field strength in a pn junction between a base region and a drift layer. Consideration for both the strengths is required to increase the breakdown voltage.

Some vertical power semiconductor devices, which are one type of power semiconductor device, include a plurality of unit cells partitioned by gate electrodes and connected in parallel to each other. The semiconductor device can be classified by arrangement pattern of the unit cells. A cell-type semiconductor device and a stripe-type semiconductor device are typical examples. In the cell-type semiconductor device, one unit cell includes a source region formed in a square pattern and a gate trench surrounding the source region. In the stripe-type semiconductor device, source regions are formed in an elongated striped pattern, and a gate trench is located between any two source regions. A plurality of unit cells constitute an element region functioning as a semiconductor element, and a termination region is located to surround the element region.

A peripheral portion of the element region adjacent to the termination region and a portion of the element region inside the peripheral portion have different field states due to their different surrounding configurations. The field strength can thus become particularly high in the peripheral portion at application of reverse bias. The breakdown voltage of the semiconductor device is determined by the minimum breakdown voltage of individual cells, and thus cells in the peripheral portion preferably have an equal breakdown voltage to cells in the inside portion. The configuration to increase the breakdown voltage of the cells in the peripheral portion has been studied. According to Japanese Patent Application Laid-Open Publication No. 2005-322949 (Patent Document 1), for example, a trench has been stretched from an element region to a termination region to prevent the occurrence of a high field in a peripheral portion of the element region. This prevents breakdown of a gate insulating film to thereby improve the breakdown voltage of the semiconductor device.

In addition to the above-mentioned technique, many techniques of providing a diffusion region having a conductivity type opposite the conductivity type of a drift layer at a deeper location than a trench to prevent breakdown of a gate insulating film of a SiC semiconductor device are disclosed. According to WO 98/35390 (Patent Document 2), for example, a protective region having a conductivity type opposite the conductivity type of a drain region is formed at the bottom of a gate trench. According to Japanese Patent Application Laid-Open Publication No. 2009-194065 (Patent Document 3), a p-type deep layer is formed, in a direction orthogonal to a gate trench, in an n⁻drift layer at a location lower than a p-type base region. According to Japanese Patent Application Laid-Open Publication No. 2012-178536 (Patent Document 4), a source trench is formed in a silicon carbide semiconductor to reach an n⁻drift layer, and a p-type source-breakdown-voltage-holding region is formed at the bottom of the source trench. Such a diffusion region relieves field crowding at the bottom of the trench of a gate electrode when a MOSFET is off. The breakdown voltage of a switching element is thus increased.

Important characteristics that the switching element is desired to have include, in addition to a high breakdown voltage, a low on-resistance. According to WO 98/35390 (Patent Document 2) as described above, a trench gate silicon carbide semiconductor device includes, between a p-type base region and an n-type drift layer, an n-type current diffusion layer having a higher impurity concentration than the drift layer. The current diffusion layer allows current having passed through a channel formed in the base region on a side face of the trench to diffusely flow through the current diffusion layer in a lateral direction. This can reduce the on-resistance.

PRIOR ART DOCUMENTS

Patent Documents

Patent Document 1: Japanese Patent Application Laid-Open Publication No. 2005-322949
Patent Document 2: WO 98/35390
Patent Document 3: Japanese Patent Application Laid-Open Publication No. 2009-194065
Patent Document 4: Japanese Patent Application Laid-Open Publication No. 2012-178536

SUMMARY

Problem to be Solved by the Invention

In the trench gate silicon carbide semiconductor device, one way to electrically connect the gate electrode located in the element region to a gate pad is providing a trench in the termination region, and extending the gate electrode into the trench. In this case, a structure to extract the gate electrode onto the face of the semiconductor layer is required to externally apply a voltage to the gate electrode. To provide this structure, the cells in the peripheral portion of the element region adjacent to the termination region are required to have a greater width than the cells in the inside portion of the element region. For this reason and other design reasons, a space between diffusion regions located in the peripheral portion of the element region to increase the breakdown voltage can become large.

According to the study conducted by the present inventors, a large space between diffusion regions can reduce the breakdown voltage of the power semiconductor device. Specifically, an avalanche current can be concentrated on this location to cause thermal breakdown. This can reduce the breakdown voltage of the semiconductor device.

The present invention has been conceived to solve the above-mentioned problems, and aims to provide a power semiconductor device having a low on-resistance and a high breakdown voltage.

Means to Solve the Problem

A power semiconductor device according to one aspect of the present invention includes: a drift layer of a first conductivity type made from a wide bandgap semiconductor; a base region of a second conductivity type formed over the drift layer in an element region; a source region of the first conductivity type formed on the base region; a gate insulating film formed on a side face and a bottom face of an element trench, the element trench penetrating the base region and the source region to reach the drift layer; a gate electrode formed inside the element trench with the gate insulating film therebetween; a protective diffusion region of the second conductivity type formed at a deeper location in the drift layer than the element trench in the element region; a current diffusion layer of the first conductivity type formed under the base region; a gate extraction electrode formed, in a termination region surrounding the element region, inside a termination trench with an insulating film therebetween, and electrically connected to the gate electrode, the termination trench having a side face being in contact with the base region; and a termination diffusion region of the second conductivity type formed at a deeper location than the termination trench in the termination region, wherein in a sectional view, the protective diffusion region includes a first protective diffusion region and a second protective diffusion region, the first protective diffusion region being in the element region at a location closest to the termination region, the second protective diffusion region being located away from the first protective diffusion region with a first space therebetween, a second space that is a distance between the termination diffusion region and the first protective diffusion region is greater than the first space, the current diffusion layer includes a first current diffusion layer and a second current diffusion layer, the first current diffusion layer being located between the first protective diffusion region and the second protective diffusion region and having a higher impurity concentration than the drift layer, the second current diffusion layer being located between the first protective diffusion region and the termination diffusion region, and the second current diffusion layer includes a region having a lower impurity concentration than the first current diffusion layer.

A power semiconductor device according to another aspect of the present invention includes: a drift layer of a first conductivity type made from a wide bandgap semiconductor; a base region of a second conductivity type formed over the drift layer in an element region; a source region of the first conductivity type formed on the base region; a gate insulating film formed on a side face and a bottom face of an element trench, the element trench penetrating the base region and the source region to reach the drift layer; a gate electrode formed inside the element trench with the gate insulating film therebetween; a protective diffusion region of the second conductivity type formed at a deeper location in the drift layer than the element trench in the element region; a current diffusion layer of the first conductivity type formed under the base region; a gate extraction electrode formed, in a termination region surrounding the element region, inside a termination trench with an insulating film therebetween, and electrically connected to the gate electrode, the termination trench having a side face being in contact with the base region; and a termination diffusion region of the second conductivity type formed at a deeper location than the termination trench in the termination region, wherein in a sectional view, the protective diffusion region includes a first protective diffusion region being in the element region at a location closest to the termination region and a second protective diffusion region being located away from the first protective diffusion region with a first space therebetween, and a second space that is a distance between the termination diffusion region and the first protective diffusion region is greater than the first space, the protective diffusion region includes: portions sandwiching, in a direction orthogonal to the first space, a region in which the first space is provided, and being located with a third space therebetween; and portions sandwiching, in a direction orthogonal to the second space, a region in which the second space is provided, and being located with a fourth space therebetween, and the fourth space is smaller than the third space.

A power semiconductor device according to yet another aspect of the present invention includes: a drift layer of a first conductivity type made from a wide bandgap semiconductor; a base region of a second conductivity type formed over the drift layer in an element region; a source region of the first conductivity type formed on the base region; a gate insulating film formed on a side face and a bottom face of an element trench, the element trench penetrating the base region and the source region to reach the drift layer, a gate electrode formed inside the element trench with the gate insulating film therebetween; a protective diffusion region of the second conductivity type formed at a deeper location in the drift layer than the element trench in the element region; a current diffusion layer of the first conductivity type formed under the base region; a gate extraction electrode formed, in a termination region surrounding the element region, inside a termination trench with an insulating film therebetween, and electrically connected to the gate electrode, the termination trench having a side face being in contact with the base region; and a termination diffusion region of the second conductivity type formed at a deeper location than the termination trench in the termination region, wherein in a sectional view, the protective diffusion region includes a first protective diffusion region and a second protective diffusion region, the first protective diffusion region being in the element region at a location closest to the termination region, the second protective diffusion region being located away from the first protective diffusion region with a first space therebetween, a second space that is a distance between the termination diffusion region and the first protective diffusion region is greater than the first space, the current diffusion layer is located between the first protective diffusion region and the second protective diffusion region, and has a higher impurity concentration than the drift layer, and the drift layer and the base region are in direct contact with each other between the first protective diffusion region and the termination diffusion region in the sectional view.

A power semiconductor device according to yet another aspect of the present invention includes: a drift layer of a first conductivity type made from a wide bandgap semiconductor, a base region of a second conductivity type formed over the drift layer in an element region; a source region of the first conductivity type formed on the base region; a gate insulating film formed on a side face and a bottom face of an element trench, the element trench penetrating the base region and the source region to reach the drift layer; a gate electrode formed inside the element trench with the gate insulating film therebetween; a protective diffusion region of the second conductivity type formed at a deeper location in the drift layer than the element trench in the element region; a current diffusion layer of the first conductivity type formed under the base region; a gate extraction electrode formed, in a termination region surrounding the element region, inside a termination trench with an insulating film therebetween, and electrically connected to the gate electrode, the termination trench having a side face being in contact with the base region; and a termination diffusion region of the second conductivity type formed at a deeper location than the termination trench in the termination region, wherein in a sectional view, the protective diffusion region includes a first protective diffusion region and a second protective diffusion region, the first protective diffusion region being in the element region at a location closest to the termination region, the second protective diffusion region being located away from the first protective diffusion region with a first space therebetween, a second space that is a distance between the termination diffusion region and the first protective diffusion region is greater than the first space, the current diffusion layer includes a first current diffusion layer and a second current diffusion layer, the first current diffusion layer being located between the first protective diffusion region and the second protective diffusion region and having a higher impurity concentration than the drift layer, the second current diffusion layer being located between the first protective diffusion region and the termination diffusion region and having the same thickness as the first current diffusion layer, and the second current diffusion layer includes a region being at a deeper location than the first current diffusion layer.

Effects of the Invention

According to the power semiconductor device according to one aspect of the present invention, the second current diffusion layer located close to the termination region includes the region having a lower impurity concentration than the first current diffusion layer. In other words, the first current diffusion layer has a higher impurity concentration than this region. Due to the presence of the first current diffusion layer having a higher impurity concentration as described above, a current sufficiently diffuses in the lateral direction in a portion of the element region other than the portion close to the termination region when the power semiconductor device is on. As a result, a low on resistance can be obtained. On the other hand, when the power semiconductor element is reverse biased, insufficient spread of a depletion layer from a pn-junction face to the drift layer between the first protective diffusion region and the termination diffusion region caused by the fact that the space between the first protective diffusion region and the termination diffusion region is greater than the space between the first and second protective diffusion regions can be compensated for by the fact that the second current diffusion layer includes the region having a lower impurity concentration as described above. Reduction in breakdown voltage caused by avalanche breakdown occurring between the first protective diffusion region and the termination diffusion region is thus prevented. The power semiconductor device having a low on-resistance and a high breakdown voltage can be obtained as described above.

According to the power semiconductor device according to another aspect of the present invention, a current sufficiently diffuses in the lateral direction due to the presence of the current diffusion layer when the power semiconductor device is on. As a result, a low on-resistance can be obtained. On the other hand, when the semiconductor device is reverse biased, the fourth space smaller than the third space can compensate for insufficient spread of the depletion layer caused by the fact that the second space is greater than the first space. In other words, the spread of the depletion layer along the fourth space can compensate for insufficient spread of the depletion layer along the second space. Reduction in breakdown voltage caused by avalanche breakdown occurring between the first protective diffusion region and the termination diffusion region is thus prevented.

According to the power semiconductor device according to yet another aspect of the present invention, the current diffusion layer having a higher impurity concentration than the drift layer is located between the first protective diffusion region and the second protective diffusion region. Thus, when the power semiconductor device is on, a current sufficiently diffuses in the lateral direction in the portion of the element region other than the portion close to the termination region. As a result, a low on-resistance can be obtained. On the other hand, the drift layer and the base region are in direct contact with each other between the first protective diffusion region and the termination diffusion region. This can compensate for insufficient spread of the depletion layer from the pn-junction face to the drift layer between the first protective diffusion region and the termination diffusion region caused by the fact that the space between the first protective diffusion region and the termination diffusion region is greater than the space between the first and second protective diffusion regions, when the power semiconductor element is reverse biased. Reduction in breakdown voltage caused by avalanche breakdown occurring between the first protective diffusion region and the termination diffusion region is thus prevented. The power semiconductor device having a low on-resistance and a high breakdown voltage can be obtained as described above.

According to the power semiconductor device according to yet another aspect of the present invention, the second current diffusion layer located close to the termination region includes the region being at a deeper location than the first current diffusion layer. In other words, the first current diffusion layer is at a shallower location than this region. Due to the presence of the first current diffusion layer being at a shallower location, a current effectively diffuses in the lateral direction in the portion of the element region other than the portion close to the termination region when the power semiconductor device is on. As a result, a low on-resistance can be obtained. On the other hand, when the power semiconductor element is reverse biased, insufficient spread of the depletion layer from the pn-junction face to the drift layer between the first protective diffusion region and the termination diffusion region caused by the fact that the space between the first protective diffusion region and the termination diffusion region is greater than the space between the first and second protective diffusion regions can be compensated for by the fact that the second current diffusion layer includes the region being at a deeper location as described above. Reduction in breakdown voltage caused by avalanche breakdown occurring between the first protective diffusion region and the termination diffusion region is thus prevented. The power semiconductor device having a low on-resistance and a high breakdown voltage can be obtained as described above.

Objects, features, aspects and advantages of the present invention will become more apparent from the following detailed description and the accompanying drawings.

BRIEF DESCRIPTION OF DRAWINGS

FIG. 2 is an enlarged view of a broken line range II of FIG. 1.

FIG. 12 is a sectional view schematically showing a seventh process of the method of manufacturing the power semiconductor device of FIG. 3.

DESCRIPTION OF EMBODIMENTS

Embodiments of the present invention will be described below based on the drawings.

Embodiment 1

Figure 1:
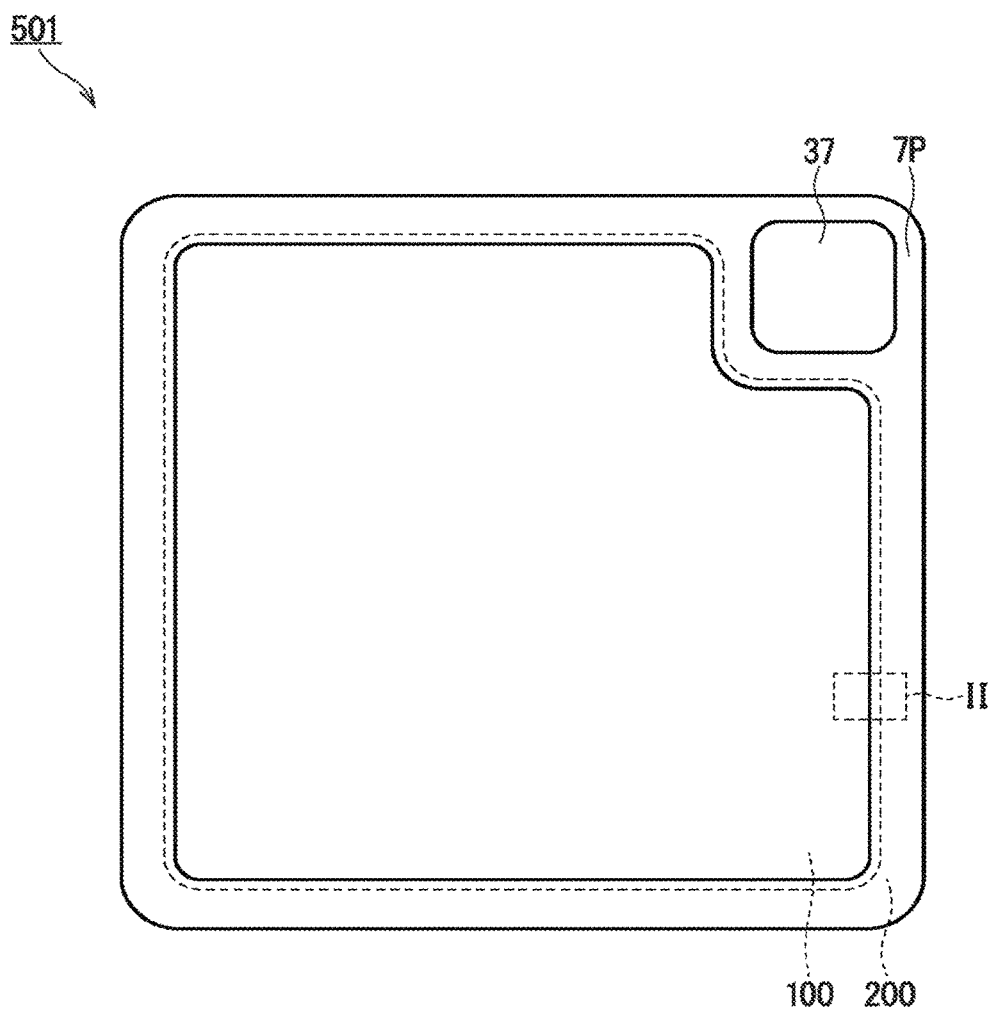
FIG. 1 is a plan view schematically showing an element region and a termination region of a power semiconductor device according to Embodiment 1 of the present invention.

FIG. 1 is a plan view schematically showing an element region 100 and a termination region 200 of a MOSFET 501 (power semiconductor device) according to the present embodiment. FIG. 2 is an enlarged view of a broken line range II of FIG. 1.

The element region 100 is a region serving as a MOSFET element (semiconductor switching element). The termination region 200 surrounds the element region 100. The MOSFET 501 is a semiconductor chip, and has an approximately quadrilateral shape as a whole. A gate pad 37 for receiving an input of a gate voltage is provided in the termination region 200. The MOSFET having a quadrilateral shape can facilitate dicing to cut a wafer into chips, and can reduce the area of the gate pad 37 relative to the total area of the MOSFET. The MOSFET 501 includes a gate extraction electrode 7P in the termination region 200. The gate extraction electrode 7P is connected to the gate electrode 7 as illustrated in FIG. 2. The gate extraction electrode 7P is thus electrically connected to the gate electrode 7. Although the gate extraction electrode 7P completely surrounds the element region 100 in FIG. 1, the gate extraction electrode 7P does not have to be provided in such a manner as long as the gate extraction electrode 7P is connected to the gate pad 37.

Figure 3:
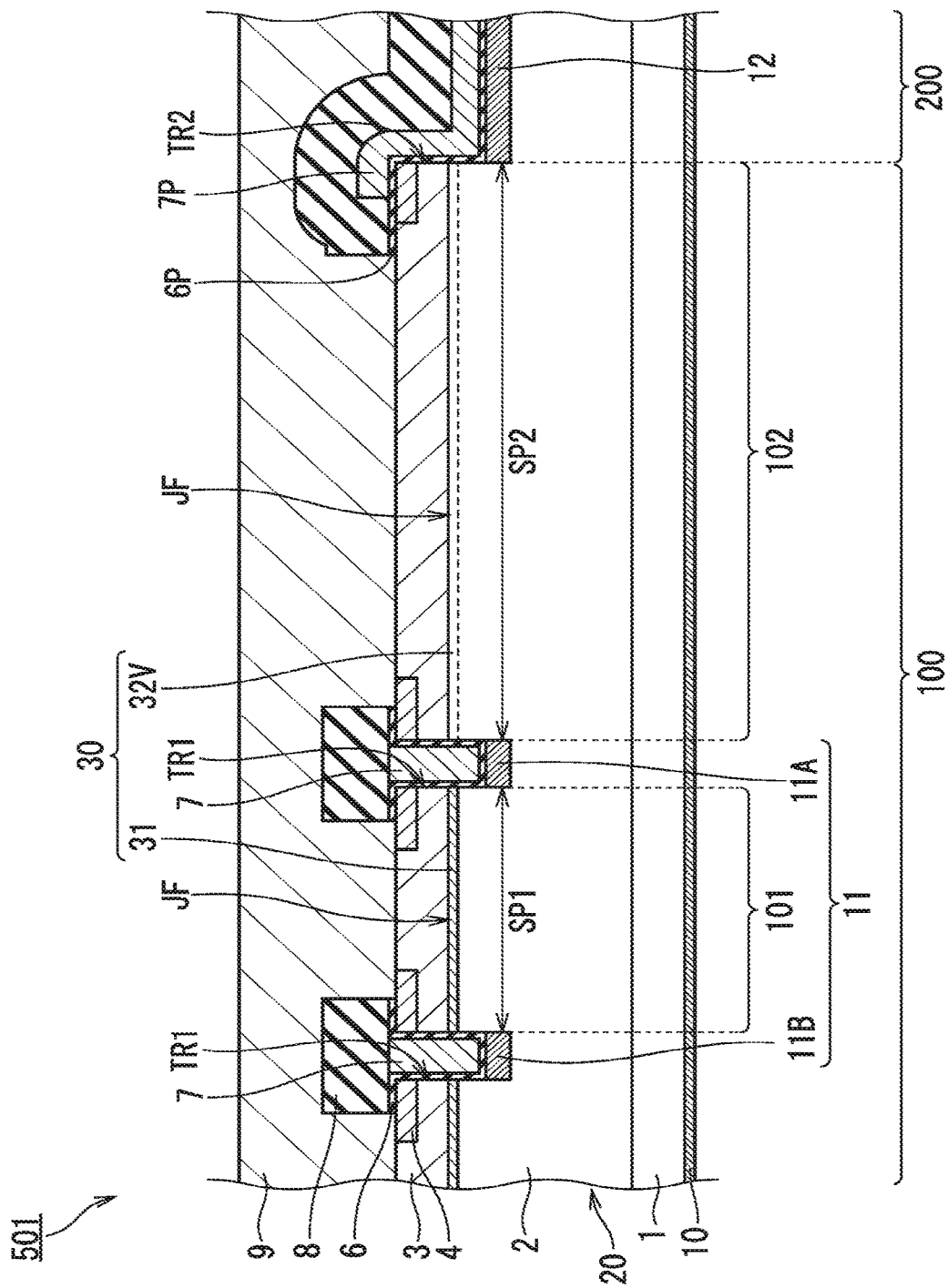
FIG. 3 is a schematic sectional view taken along the line III-III of FIG. 2.

FIG. 3 is a schematic sectional view taken along the line III-III of FIG. 2. The element region 100 has the cell configuration. Specifically, a plurality of cell regions including a peripheral cell region 102 located in an outermost peripheral portion of the element region 100 and an active cell region 101 located inside the peripheral cell region 102 are provided in the element region 100. Each of the cell regions is a unit region having the function of a MOSFET element.

The MOSFET 501 includes an n-type (a first conductivity type) SiC substrate 1, an epitaxial layer 20, a gate insulating film 6, an insulating film 6P, a gate electrode 7, a gate extraction electrode 7P, a source electrode 9, a drain electrode 10, and an interlayer insulating film 8. The SiC substrate 1 and the epitaxial layer 20 each extend across the element region 100 and the termination region 200. The epitaxial layer 20 includes an n-type drift layer 2, an n-type current diffusion layer 30, a p-type (a second conductivity type different from the first conductivity type) p-base region 3, an n-type source region 4, a p-type protective diffusion region 11, and a p-type termination diffusion region 12.

The drift layer 2 is provided on the SiC substrate 1. The current diffusion layer 30 is formed under the p-base region 3, and is located on the drift layer 2. The current diffusion layer 30 has a pn-junction face JF being in contact with the p-base region 3. The p-base region 3 is provided, in the element region 100, over the drift layer 2 with the current diffusion layer 30 therebetween. The source region 4 is provided on the p-base region 3.

The epitaxial layer 20 has an element trench TR1 located in the element region 100. The element trench TR1 has a side face being in contact with the drift layer 2, the current diffusion layer 30, the p-base region 3, and the source region 4. The element trench TR1 is formed to penetrate the p-base region 3 and the source region 4 to reach the drift layer 2. The epitaxial layer 20 also has a termination trench TR2 located in the termination region 200. In the present embodiment, the termination trench TR2 also has a side face being in contact with the drift layer 2, the current diffusion layer 30, the p-base region 3, and the source region 4 in the element region 100. An inner peripheral side face (a left side face in FIG. 3) of the termination trench TR2 corresponds to the boundary between the element region 100 and the termination region 200.

The protective diffusion region 11 is formed at a deeper location in the drift layer 2 than the element trench TR1 in the element region 100. In the present embodiment, the element trench TR1 has a bottom face covered with the protective diffusion region 11. In the sectional view of FIG. 3, namely, in a sectional view parallel to the thickness of the epitaxial layer 20, the protective diffusion region 11 includes a protective diffusion region 11A (first protective diffusion region) being in the element region 100 at a location closest to the termination region 200 and a protective diffusion region 11B (second protective diffusion region) being located away from the protective diffusion region 11A with a space SP1 (first space) therebetween.

The termination diffusion region 12 is formed at a deeper location than the termination trench TR2 in the termination region 200. In the present embodiment, the termination trench TR2 has a bottom face covered with the termination diffusion region 12. In the sectional view of FIG. 3, a space SP2 (second space) that is a distance between the termination diffusion region 12 and the protective diffusion region 11A is greater than the space SP1.

In the sectional view of FIG. 3, a plurality of element trenches TR1 are located with a space approximately similar to the space SP1 therebetween. The termination trench TR2 is located away from the element trench TR1 with a space approximately similar to the space SP2 therebetween.

The current diffusion layer 30 includes a current diffusion layer 31 (first current diffusion layer) and a current diffusion layer 32V (second current diffusion layer). The current diffusion layer 31 is located between the protective diffusion region 11A and the protective diffusion region 11B, and has a higher impurity concentration than the drift layer 2. On the other hand, the current diffusion layer 32V (indicated in a broken line in FIG. 3) has an equal impurity concentration to the drift layer 2, and is located between the protective diffusion region 11A and the termination diffusion region 12. This means that the current diffusion layer 32V in the present embodiment is defined by an imaginary region located under the p-base region 3 between the protective diffusion region 11A and the termination diffusion region 12 and having the same thickness as the current diffusion layer 31. All of the current diffusion layer 32V thus has a lower impurity concentration than the current diffusion layer 31. Described more directly, in the present embodiment, the current diffusion layer having a higher impurity concentration than the drift layer 2 is provided between the drift layer 2 and the base region 3 between the protective diffusion region 11A and the protective diffusion region 11B, and no current diffusion layer having a higher impurity concentration than the drift layer 2 is provided between the protective diffusion region 11A and the termination diffusion region 12 so that the drift layer 2 and the p-base region 3 are in direct contact with each other between the protective diffusion region 11A and the termination diffusion region 12.

With the above-mentioned configuration, the impurity concentration on the pn-junction face JF of the current diffusion layer 30 is lower between the protective diffusion region 11A and the termination diffusion region 12 than between the protective diffusion region 11A and the protective diffusion region 11B.

The drift layer 2 is made from a wide bandgap semiconductor. The current diffusion layer 30 is also preferably made from a wide bandgap semiconductor. The epitaxial layer 20 as a whole is more preferably made from a wide bandgap semiconductor. In the present embodiment, SiC is used as the wide bandgap semiconductor.

The gate insulating film 6 is formed on the bottom face and the side face of the element trench TR1. The insulating film 6P includes a portion formed on the bottom face and the side face of the termination trench TR2 in the termination region 200 and a portion located on the epitaxial layer 20 in the element region 100. The gate electrode 7 is provided inside the element trench TR1 with the gate insulating film 6 therebetween. The gate extraction electrode 7P is provided in the termination trench TR2 with the insulating film 6P therebetween. The gate extraction electrode 7P includes a portion extending from the inside to the outside of the termination trench TR2 towards the element region 100. This configuration enables the gate extraction electrode 7P to easily be connected to the gate pad 37 (FIG. 1). To achieve this configuration, the peripheral cell region 102 has a greater width than the active cell region 101 in the sectional view of FIG. 3. For this reason, in a plan view of FIG. 2, the active cell region 101 has a square shape, whereas the peripheral cell region 102 has a rectangular shape having longer sides extending along a direction in which the element region 100 and the termination region 200 are adjacent to each other.

Figure 4:
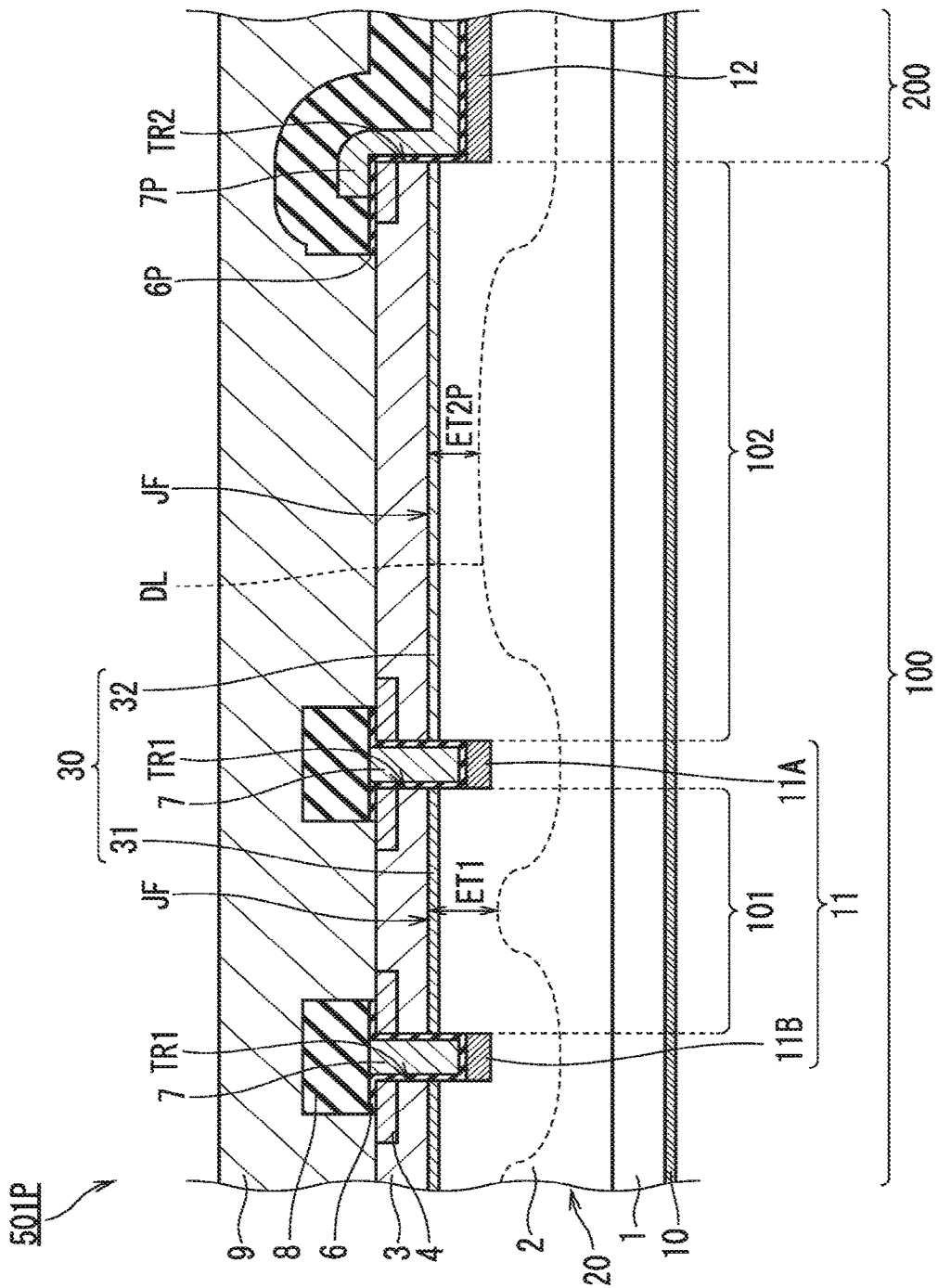
FIG. 4 is a sectional view illustrating the spread of a depletion layer when a power semiconductor device according to a comparative example is reverse biased.

A MOSFET 501P according to a comparative example (FIG. 4) will be described next. Between the protective diffusion region 11A and the termination diffusion region 12, the MOSFET 501P includes a current diffusion layer 32 only including a region having the same impurity concentration as the current diffusion layer 31. Upon application of a reverse bias voltage to the MOSFET 501P, a depletion layer DL spreads towards the drift layer 2 from each of the pn-junction face JF, the protective diffusion region 11, and the termination diffusion region 12. Depletion from the pn-junction face JF has the effect of depressing the depletion layer extending from the protective diffusion region 11 and the termination diffusion region 12. Depletion proceeds from the protective diffusion region 11 and the termination diffusion region 12 not only in the depth direction but also in the lateral direction. The reverse bias voltage is held by the spreading depletion layer DL.

The current diffusion layers 31 and 32 each having a higher impurity concentration than the drift layer 2 have the action of suppressing the spread of the depletion layer DL. On the other hand, between the protective diffusion regions 11A and 11B being located away from each other with the smaller space SP1 (FIG. 3) therebetween, the spread of the depletion layer DL is promoted by depletion from the protective diffusion regions 11A and 11B, and thus the above-mentioned suppressing action is at least partially canceled out. Between the protective diffusion region 11A and the termination diffusion region 12 being located away from each other with the greater space SP2 (FIG. 3) therebetween, however, depletion from the protective diffusion region 11A and the termination diffusion region 12 is less likely to have the action on a portion remote from the protective diffusion region 11A and the termination diffusion region 12, and thus the spread of the depletion layer DL is suppressed by the above-mentioned suppressing action. As a result, ET2P<ET1 holds true when ET1 represents the depth of the depletion layer DL spreading from the pn-junction face JF between the protective diffusion regions 11A and 11B, and ET2P represents the depth of the depletion layer DL spreading from the pn-junction face JF between the protective diffusion region 11A and the termination diffusion region 12. When the reverse bias voltage increases, an avalanche occurs between the protective diffusion region 11A and the termination diffusion region 12 before occurring between the protective diffusion regions 11A and 11B. This voltage defines an upper limit of the breakdown voltage of the MOSFET 501P.

Figure 5:
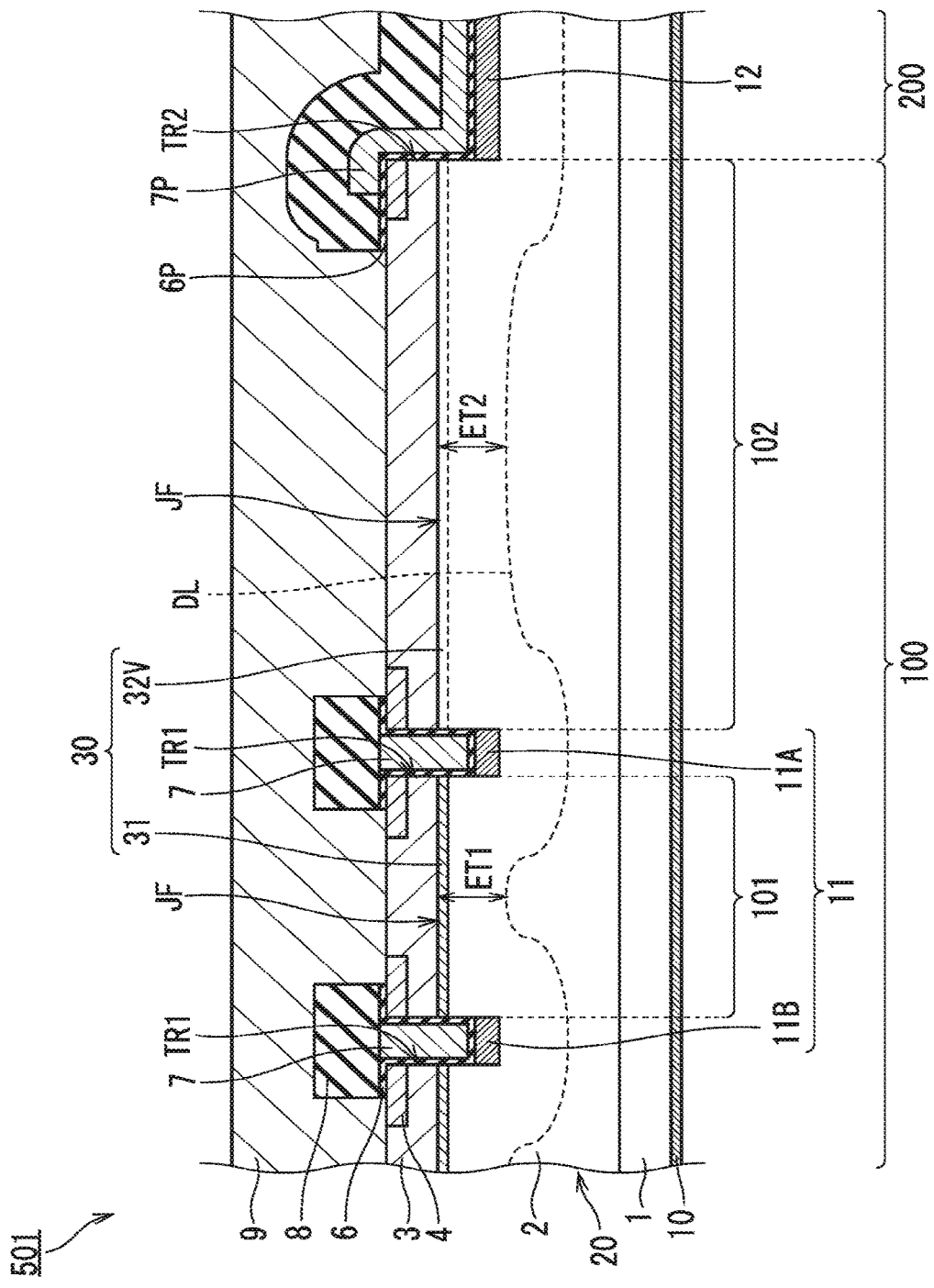
FIG. 5 is a sectional view illustrating the spread of a depletion layer when the power semiconductor device of FIG. 3 is reverse biased.

Referring to FIG. 5, according to the MOSFET 501 in the present embodiment, the current diffusion layer 32V between the protective diffusion region 11A and the termination diffusion region 12 has the same impurity concentration as the drift layer 2, in contrast to the current diffusion layer 31. The current diffusion layer 30 thus has no action of suppressing the spread of the depletion layer DL between the protective diffusion region 11A and the termination diffusion region 12. The depth ET2 of the depletion layer DL spreading from the pn-junction face JF between the protective diffusion region 11A and the termination diffusion region 12 can thus be approximately equal to or greater than the depth ET1. This can avoid reduction in breakdown voltage caused by an avalanche occurring between the protective diffusion region 11A and the termination diffusion region 12. In other words, an imbalance in breakdown voltage in the MOSFET 501 can be eliminated. The breakdown voltage of the MOSFET 501 can thus be increased.

The method of manufacturing the MOSFET 501 will be described next below.

Figure 6:
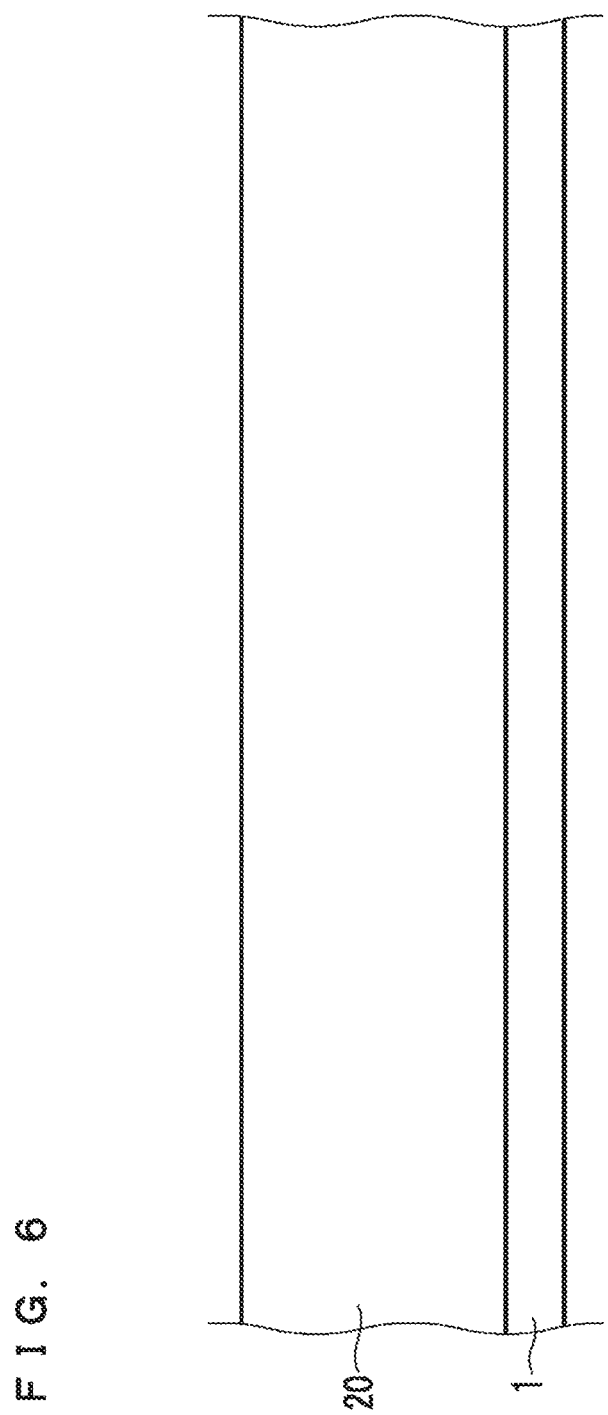
FIG. 6 is a sectional view schematically showing a first process of a method of manufacturing the power semiconductor device of FIG. 3.

Referring to FIG. 6, the SiC substrate 1 is first prepared. For example, an n-type low-resistance SiC substrate 1 made from SiC having a 4H polytype is prepared. The n-type epitaxial layer 20 is formed on the SiC substrate 1 through epitaxial growth on a first main face (an upper face in FIG. 6) of the SiC substrate 1. The epitaxial growth can be achieved, for example, by chemical vapor deposition (CVD). The epitaxial layer 20 has, for example, a donor impurity concentration of $1 \times 10^{15}$ cm$^{-3}$ to $1 \times 10^{17}$ cm$^{-3}$ inclusive and a thickness of 5 µm to 100 µm inclusive.

Figure 7:
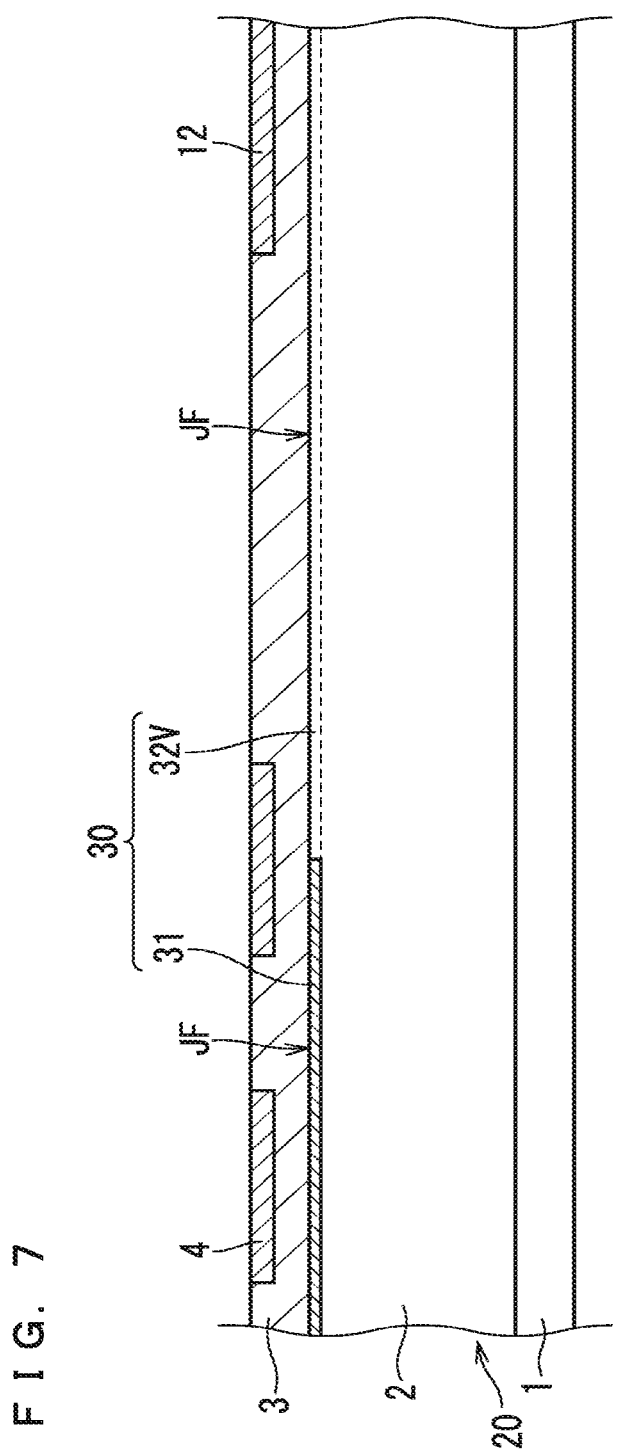
FIG. 7 is a sectional view schematically showing a second process of the method of manufacturing the power semiconductor device of FIG. 3.

Referring to FIG. 7, a predetermined dopant is introduced, as an acceptor, into a surface portion of the epitaxial layer 20 by ion implantation to form the p-base region 3. The acceptor is, for example, aluminum (Al) or boron (B). The acceptor is introduced by ion implantation to a depth not exceeding the thickness of the epitaxial layer 20, for example, to a depth of approximately 0.5 µm to 3 µm. The acceptor concentration is set to be higher than the donor concentration of the epitaxial layer 20. In this case, a portion of the epitaxial layer 20 at a deeper location than the depth to which the acceptor is implanted corresponds to the drift layer 2.

Next, an implantation mask (not illustrated) is formed on an upper face of the epitaxial layer 20. A predetermined dopant as a donor is introduced into an upper portion of the drift layer 2 by ion implantation using the implantation mask. The current diffusion layer 31 is formed in the upper portion of the drift layer 2 by ion implantation, and the remaining portion corresponds to the current diffusion layer 32V and the drift layer 2. In other words, the current diffusion layer 30 including the current diffusion layer 31 having a higher impurity concentration than the drift layer 2 and the current diffusion layer 32V having the same impurity concentration as the drift layer 2 is provided in the upper portion of the drift layer 2. Referring to FIG. 3, the end of the current diffusion layer 31 is located inside a side wall in an outer peripheral direction of the outermost element trench TR1 in the active cell region 101 and is located outside a side wall in an inner peripheral direction of the outermost element trench TR1 in the active cell region 101. The location of the end of the current diffusion layer 31 can be adjusted by a pattern of the implantation mask. The pattern of the implantation mask can be adjusted by a pattern of a photomask used in photolithography for patterning the implantation mask. The implantation mask is removed after ion implantation.

Next, another implantation mask (not illustrated) is formed on the upper face of the epitaxial layer 20. A predetermined dopant as a donor is then introduced by ion implantation to form the source region 4. The source region 4 is formed in a lattice pattern corresponding to the layout of the gate electrode 7 formed thereafter in a top view. The source region 4 is thus located on opposite sides of the gate electrode 7 at formation of the gate electrode 7. The donor of the source region 4 is, for example, nitrogen (N) or phosphorus (P). The donor is introduced by ion implantation to a depth shallower than the thickness of the p-base region 3. The donor impurity concentration is set to be higher than the acceptor concentration of the p-base region 3, and is, for example, set to be in a range of $1 \times 10^{18}$ cm$^{-3}$ to $1 \times 10^{21}$ cm$^{-3}$. The implantation mask is removed after ion implantation.

The p-base region 3, the current diffusion layer 30, and the source region 4 may be formed in any order as long as the configuration illustrated in FIG. 7 is eventually obtained.

Figure 8:
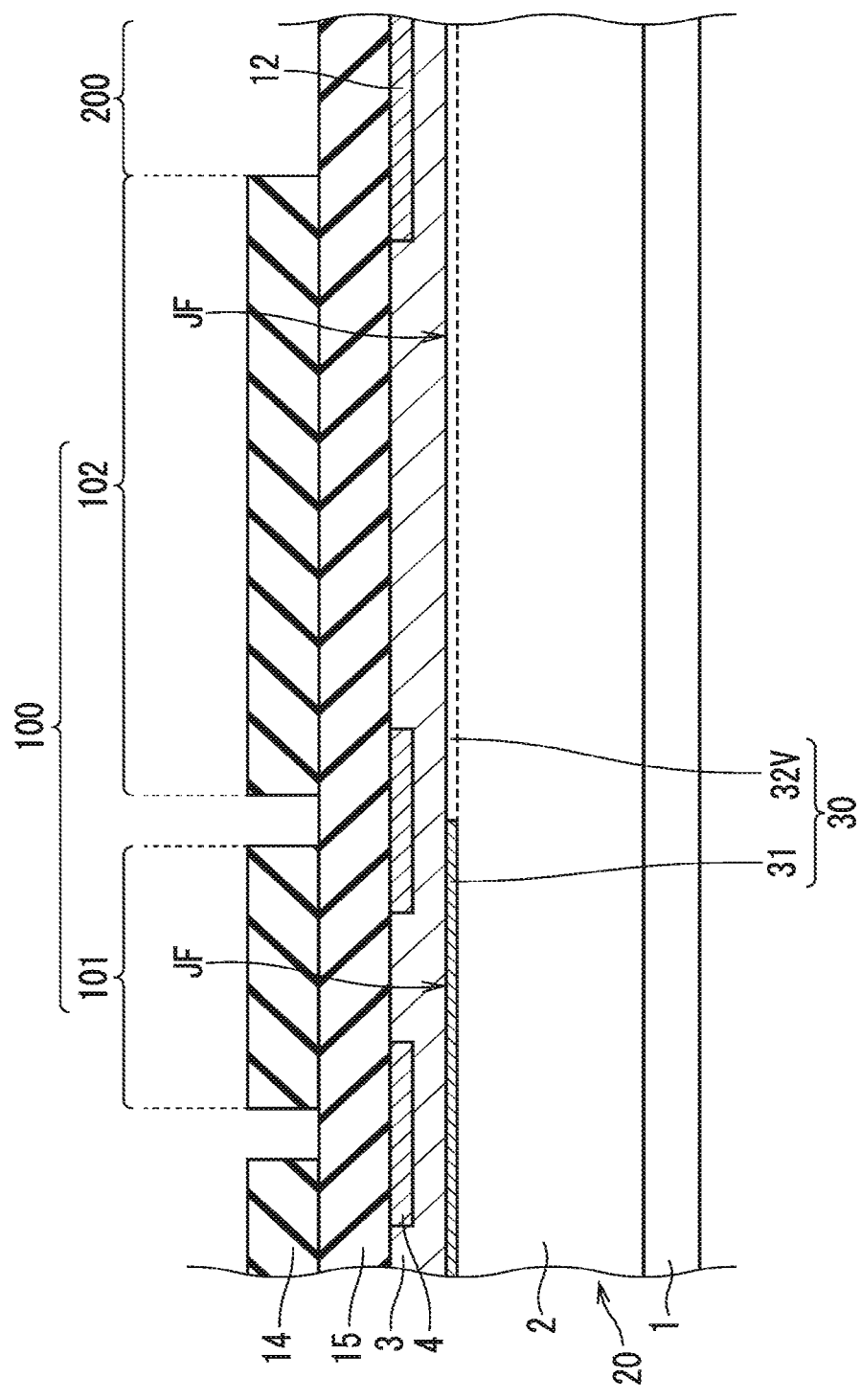
FIG. 8 is a sectional view schematically showing a third process of the method of manufacturing the power semiconductor device of FIG. 3.

Referring to FIG. 8, a silicon oxide film 15 is first formed on the upper face of the epitaxial layer 20 to form a hard mask described below. The silicon oxide film 15 has a thickness of approximately 1 µm to 2 µm, for example. A resist mask 14 is formed thereon. The resist mask 14 is provided, by photolithography, with a pattern having openings in regions in which the element trench TR1 and the termination trench TR2 (FIG. 3) are to be formed. As the element trench TR1 and the termination trench TR2 (FIG. 2) have a lattice pattern, the resist mask 14 has a matrix pattern in which the lattice pattern is inverted. The above-mentioned pattern has openings surrounding rectangles (see FIG. 2) corresponding to the peripheral cell region 102.

Figure 9:
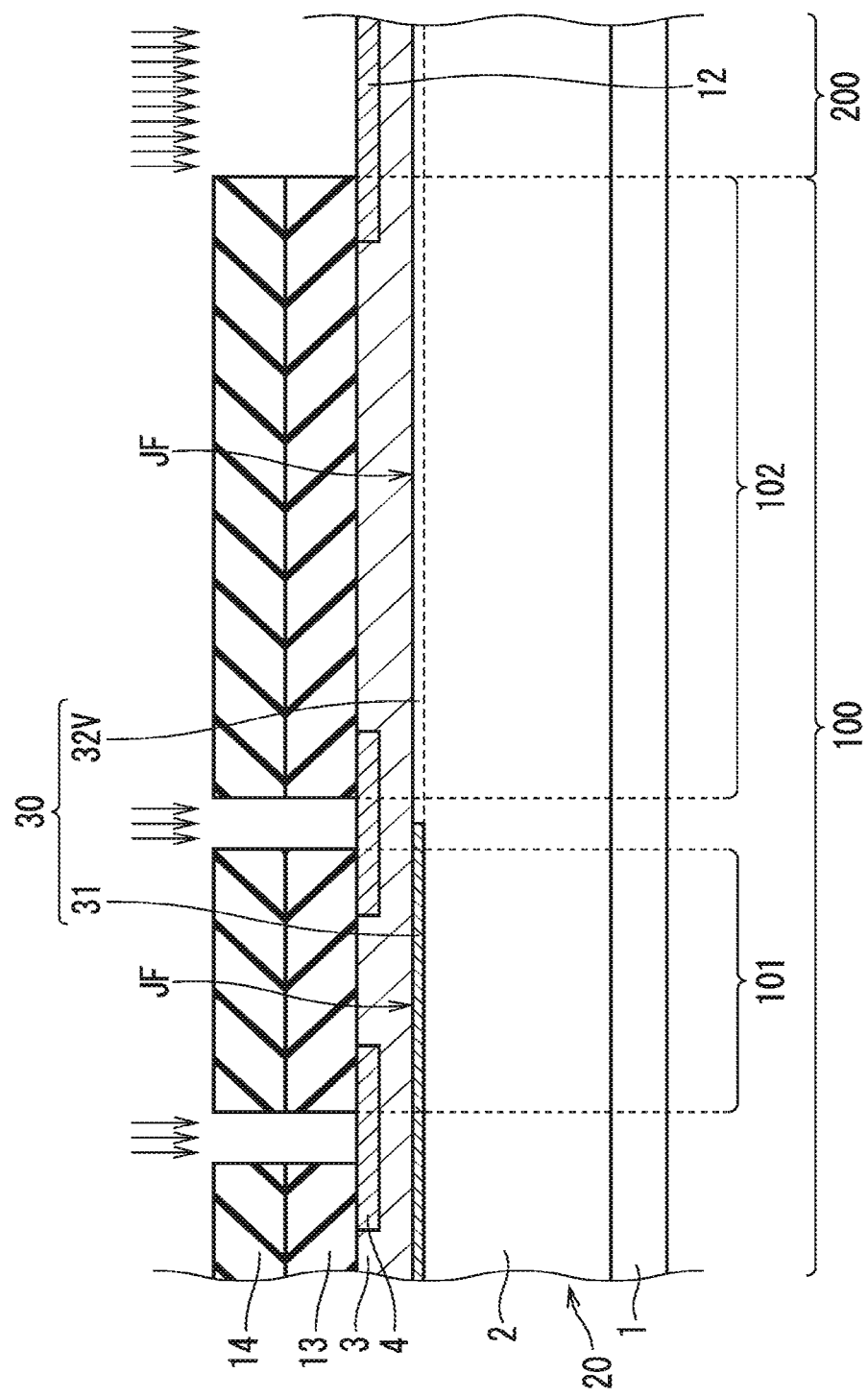
FIG. 9 is a sectional view schematically showing a fourth process of the method of manufacturing the power semiconductor device of FIG. 3.

Referring to FIG. 9, the silicon oxide film 15 is patterned by reactive ion etching (RIE) using the resist mask 14 (see arrows in FIG. 9). In other words, the pattern of the resist mask 14 is transferred to the silicon oxide film 15. A hard mask 13 is thus formed from the silicon oxide film 15. The resist mask 14 is then removed.

Figure 10:
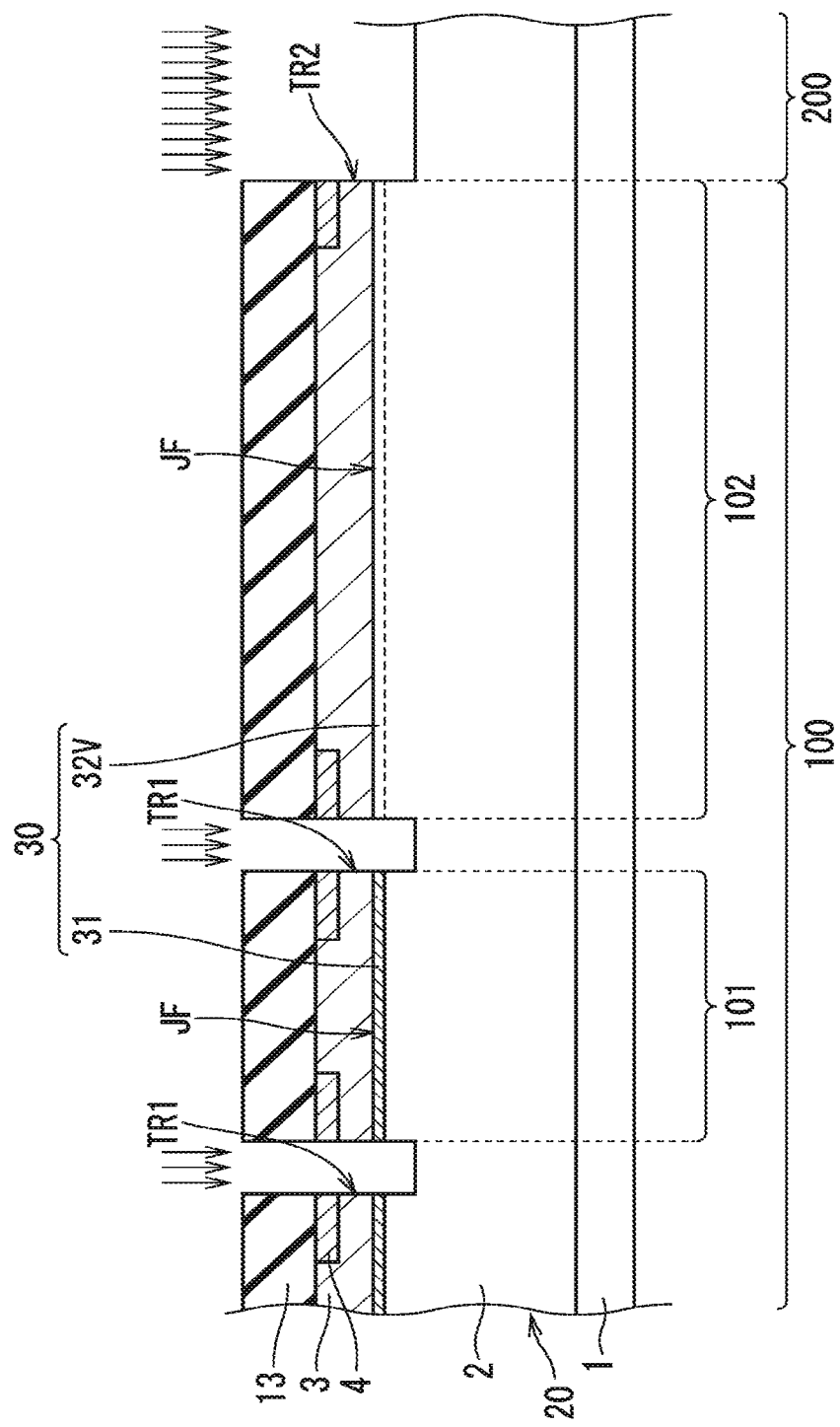
FIG. 10 is a sectional view schematically showing a fifth process of the method of manufacturing the power semiconductor device of FIG. 3.

Referring to FIG. 10, trenches penetrating the source region 4, the p-base region 3, and the current diffusion layer 30 are formed in the epitaxial layer 20 by RIE using the hard mask 13. This means that the element trench TR1 and the termination trench TR2 are formed. The element trench TR1 and the termination trench TR2 are each deeper than the location of the current diffusion layer 30, and each have a depth of approximately 1.0 µm to 6.0 µm, for example.

Figure 11:
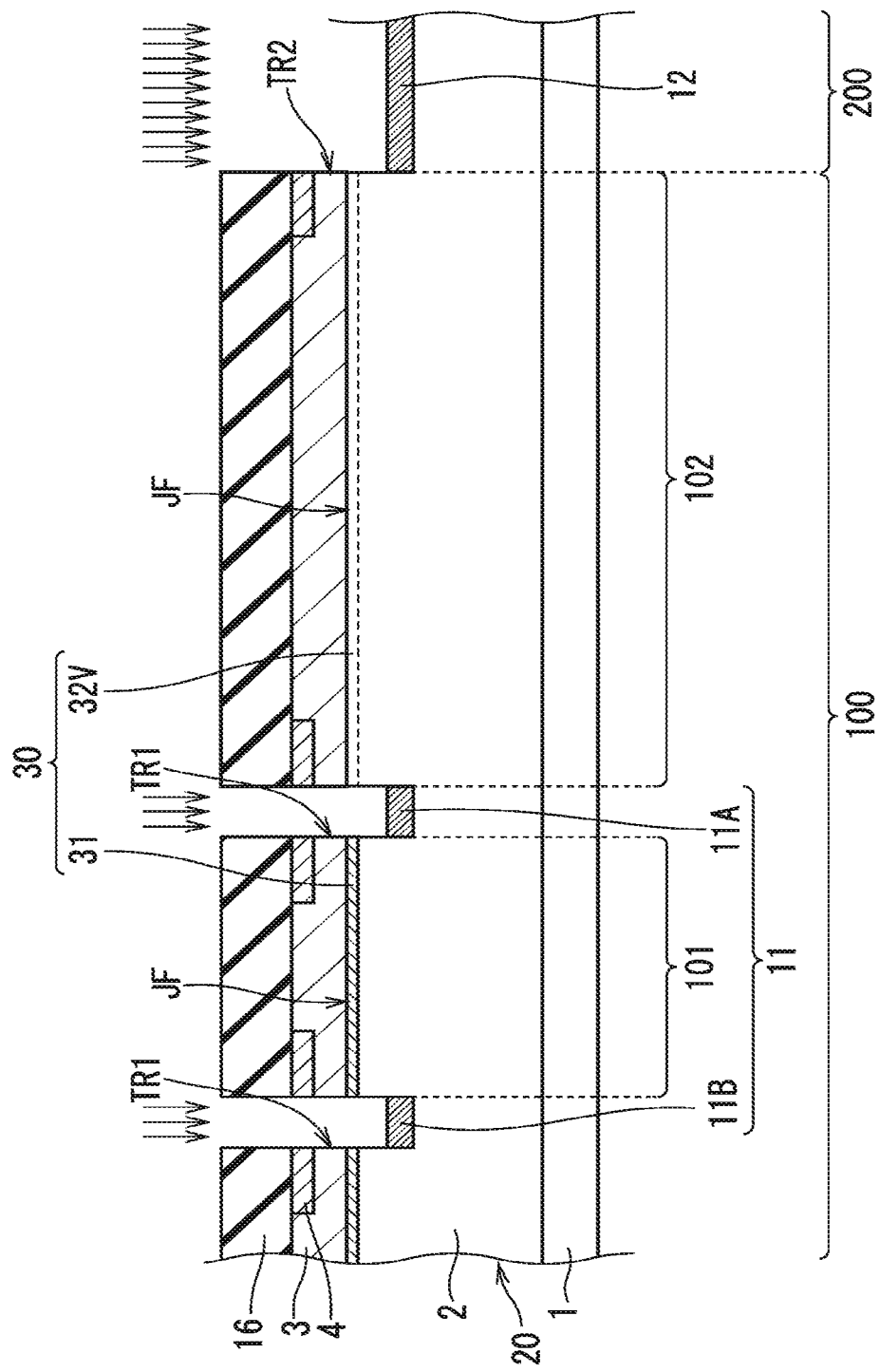
FIG. 11 is a sectional view schematically showing a sixth process of the method of manufacturing the power semiconductor device of FIG. 3.

Referring to FIG. 11, an implantation mask 16 having a pattern from which the element trench TR1 and the termination trench TR2 are exposed, namely, a partially cut-out matrix pattern as with the pattern of the resist mask 14 is formed. The protective diffusion region 11 and the termination diffusion region 12 are formed at the respective bottoms of the element trench TR1 and the termination trench TR2 by ion implantation using the implantation mask 16. The implantation mask 16 is then removed.

Formation of the implantation mask 16 may be omitted to use the hard mask 13 in place of the implantation mask 16. This leads to simplification of the manufacturing process and cost reduction. In this case, the hard mask 13 has to have a thickness required to function as an ion implantation mask at completion of RIE for forming the element trench TR1 and the termination trench TR2. The thickness of the hard mask 13 at the time can be adjusted by the thickness of the silicon oxide film 15 first formed and conditions under which RIE is performed.

Next, annealing is performed using heat treatment equipment to electrically activate the implanted impurities. Annealing is performed, for example, in an atmosphere of inert gas, such as argon (Ar) gas, or in a vacuum at a temperature of approximately 1300° C. to 1900° C. for approximately 30 seconds to one hour.

Referring to FIG. 12, a silicon oxide film 6A (an insulating film) including portions serving as the gate insulating film 6 and the insulating film 6P (FIG. 3) is formed over the entire upper face of the epitaxial layer 20 including the bottom faces and the side faces of the element trench TR1 and the termination trench TR2. The silicon oxide film 6A may be formed by either thermal oxidation or deposition. Next, a polysilicon film 7A (conductor film) including portions serving as the gate electrode 7 and the gate extraction electrode 7P (FIG. 3) is formed on the silicon oxide film 6A. The polysilicon film 7A can be formed, for example, by low pressure CVD. Next, an etching mask 19 selectively covering a portion of the polysilicon film 7A serving as the gate extraction electrode 7P (FIG. 3) is formed. The etching mask 19 includes a portion extending from the inside to the outside of the termination trench TR2 towards the element region 100. This portion can be formed more easily without the need for high-precision processing when the element trench TR1 and the termination trench TR2 are located with a greater space therebetween. Next, the polysilicon film 7A is patterned by etching using the etching mask 19.

Figure 13:
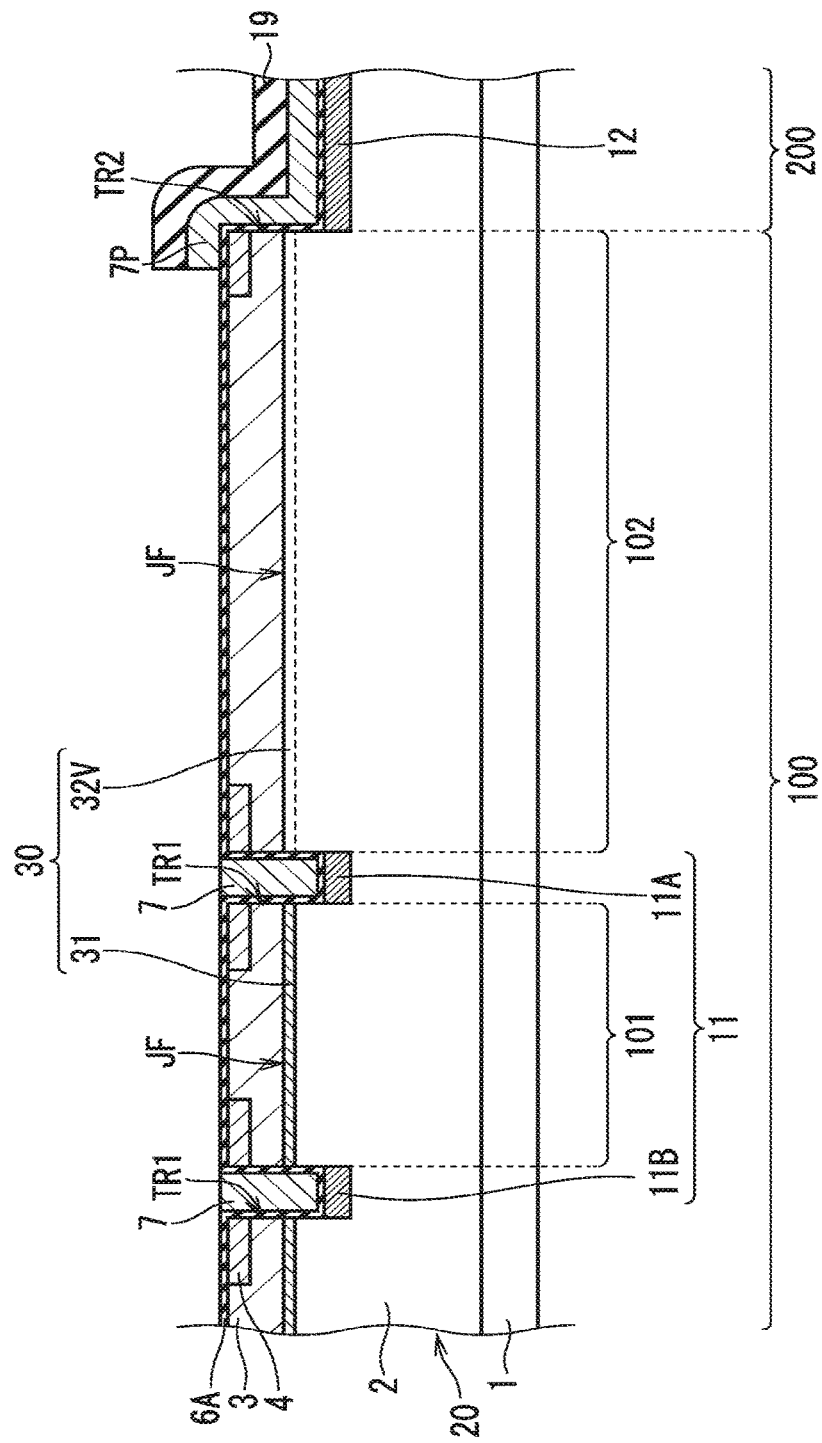
FIG. 13 is a sectional view schematically showing an eighth process of the method of manufacturing the power semiconductor device of FIG. 3.

Referring to FIG. 13, the gate extraction electrode 7P and the gate electrode 7 are formed by the patterning described above. A portion of the gate electrode 7 inside the element trench TR1 can remain even when the portion is not covered with the etching mask 19 as the element trench TR1 has a small width. In other words, the portion of the gate electrode 7 inside the element trench TR1 can be formed by etch back without using the etching mask. The etching mask 19 is then removed.

Figure 14:
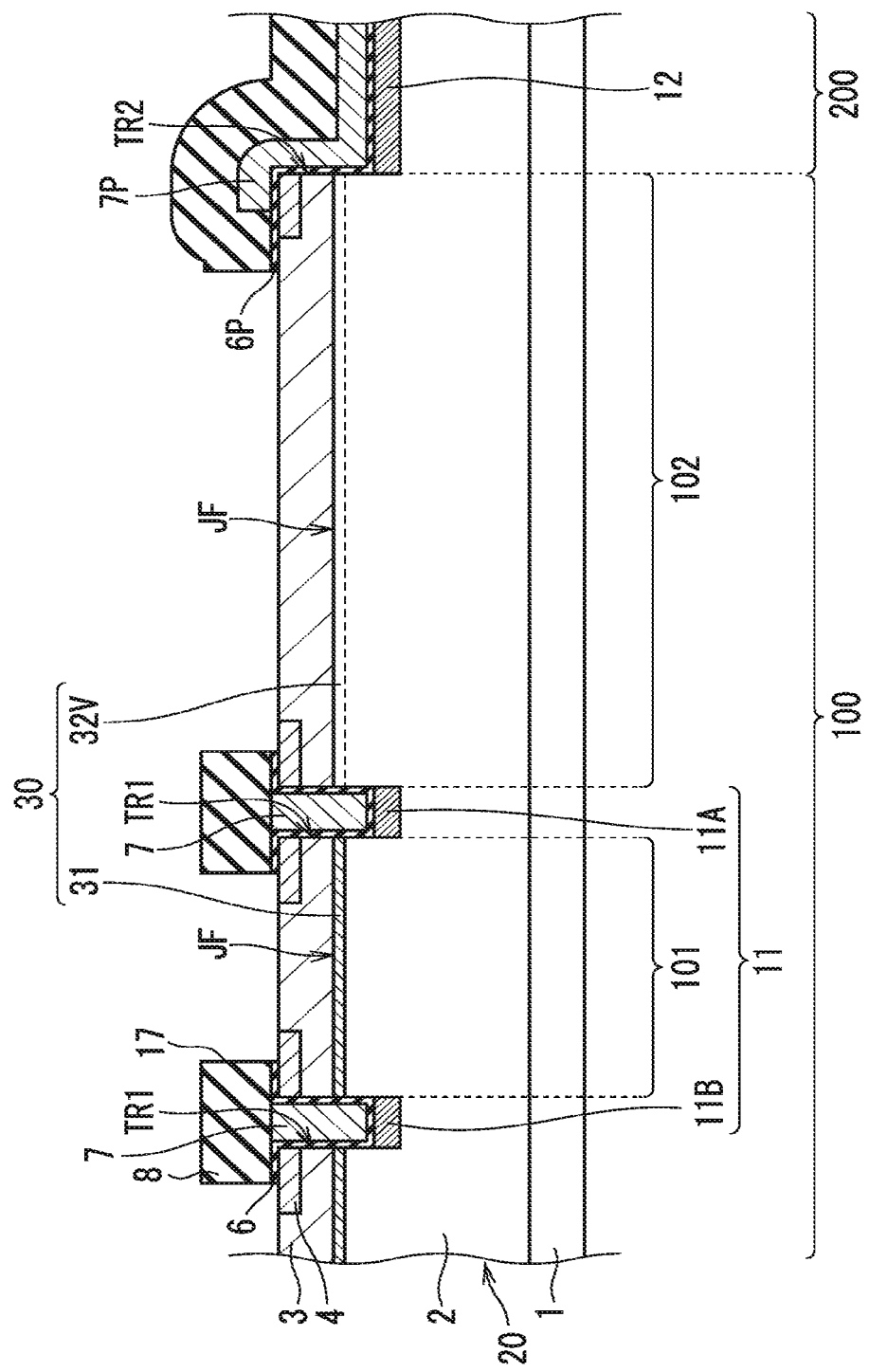
FIG. 14 is a sectional view schematically showing a ninth process of the method of manufacturing the power semiconductor device of FIG. 3.

Referring to FIG. 14, an insulating film is deposited by low pressure CVD and patterned on the epitaxial layer 20 over which the gate insulating film 6 and the gate electrode 7 have been provided. The insulating film is patterned so that the gate electrode 7 is covered with the interlayer insulating film 8. The silicon oxide film 6A (FIG. 13) is also patterned at the patterning of the insulating film to form the gate insulating film 6 and the insulating film 6P. A contact hole 17 penetrating the interlayer insulating film 8 and the gate insulating film 6 to reach the source region 4 and the p-base region 3 is thus formed.

Next, an ohmic electrode is formed on upper faces of the source region 4 and the p-base region 3 exposed at the bottom of the contact hole 17. For example, a metal film including nickel (Ni) as a main component is formed over the entire upper face of the epitaxial layer 20 including the inside of the contact hole 17. Next, the metal film is caused to react with a silicon carbide by heat treatment performed at 600° C. to 1100° C. to form a silicide film serving as the ohmic electrode. An unreacted portion of the metal film remaining on the interlayer insulating film 8 is then removed by wet etching using nitric acid, sulfuric acid, hydrochloric acid, or a mixture of these types of acid and aqueous hydrogen peroxide. Heat treatment may be performed again after removal of the portion of the metal film remaining on the interlayer insulating film 8. The second treatment is preferably performed at a temperature higher than the temperature at which the first heat treatment is performed, and thus an ohmic contact is achieved with a low contact resistance.

An electrode material, such as an Al alloy and copper (Cu), is further deposited to cover the ohmic electrode and the interlayer insulating film 8. The source electrode 9 (FIG. 3) is thus formed on the interlayer insulating film 8 and in the contact hole 17. An electrode material, such as an Al alloy and Cu, is also deposited on a back face as a second main face of the SiC substrate 1 to form the drain electrode 10. The MOSFET 501 (FIG. 3) is obtained as described above.

According to the present embodiment, the current diffusion layer 31 has a higher impurity concentration than the current diffusion layer 32V located close to the termination region 200. Due to the presence of the current diffusion layer 31 having a higher impurity concentration, when the MOSFET 501 is on, a current sufficiently diffuses in the lateral direction in a portion of the element region 100 other than a portion close to the termination region 200. As a result, a low on-resistance can be obtained. On the other hand, when the MOSFET 501 is reverse biased, insufficient spread of the depletion layer from the pn-junction face JF to the drift layer 2 between the protective diffusion region 11A and the termination diffusion region 12 caused by the fact that the space SP2 between the protective diffusion region 11A and the termination diffusion region 12 is greater than the space SP1 between the protective diffusion regions 11A and 11B can be compensated for by the fact that the current diffusion layer 32V has a lower impurity concentration than the current diffusion layer 31. Reduction in breakdown voltage caused by avalanche breakdown occurring between the protective diffusion region 11A and the termination diffusion region 12 is thus prevented. The MOSFET 501 having a low on-resistance and a high breakdown voltage can be obtained as described above.

The current diffusion layer 32V has the same impurity concentration as the drift layer 2. This can simplify the process of forming the current diffusion layer 30.

In other words, according to the present embodiment, the current diffusion layer having a higher impurity concentration than the drift layer 2 is located between the protective diffusion regions 11A and 11B. Thus, a current sufficiently diffuses in the lateral direction in the portion of the element region 100 other than the portion close to the termination region 200 when the MOSFET 501 is on. As a result, a low on-resistance can be obtained. On the other hand, the drift layer 2 and the p-base region 3 are in direct contact with each other between the protective diffusion region 11A and the termination diffusion region 12. This can compensate for insufficient spread of the depletion layer from the pn-junction face JF to the drift layer 2 between the protective diffusion region 11A and the termination diffusion region 12, which is caused by the fact that the space SP2 between the protective diffusion region 11A and the termination diffusion region 12 is greater than the space SP1 between the protective diffusion regions 11A and 11B, when the MOSFET 501 is reverse biased. Reduction in breakdown voltage caused by avalanche breakdown occurring between the protective diffusion region 11A and the termination diffusion region 12 is thus prevented. The MOSFET 501 having a low on-resistance and a high breakdown voltage can be obtained as described above.

The termination trench TR2 has the side face being in contact with the drift layer 2, the p-base region 3, and the source region 4 in the element region 100. A portion of the element region 100 being in contact with the termination trench TR2 can thus also function as a transistor. This can further reduce the on resistance. If this action is unnecessary, the termination trench TR2 does not have to be in contact with each of the drift layer 2, the p-base region 3, and the source region 4.

The current diffusion layer 31 having a higher impurity concentration than the drift layer 2 is not provided on the pn-junction face JF between the protective diffusion region 11A and the termination diffusion region 12. This can further compensate for insufficient spread of the depletion layer from the pn-junction face JF to the drift layer 2 between the protective diffusion region 11A and the termination diffusion region 12 when the MOSFET 501 is reverse biased. This further ensures that reduction in breakdown voltage caused by avalanche breakdown occurring between the protective diffusion region 11A and the termination diffusion region 12 is prevented.

The element trench TR1 has the bottom face covered with the protective diffusion region 11. In this case, the protective diffusion region 11 can easily be formed by ion implantation into the bottom face of the element trench TR1. The termination trench TR2 has the bottom face covered with the termination diffusion region 12. In this case, the termination diffusion region 12 can easily be formed by ion implantation into the bottom face of the termination trench TR2.

The plurality of element trenches TR1 are located with the space approximately similar to the space SP1 therebetween. The termination trench TR2 is located away from the element trench TR1 with the space approximately similar to the space SP2 therebetween. In other words, the current diffusion layer 31 having a higher impurity concentration is provided in the active cell region 101, in which the trenches are located with a smaller space therebetween, to reduce the on resistance, and is not provided in the peripheral cell region 102, in which the trenches are located with a greater space therebetween, to increase the breakdown voltage. This can eliminate the imbalance in breakdown voltage in the MOSFET 501, and thus prevent thermal breakdown caused by concentration of an avalanche current on the peripheral cell region 102.

Modifications

In the above-mentioned embodiment, the element trench TR1 has the bottom face covered with the protective diffusion region 11 as illustrated in FIG. 3. The protective diffusion region 11 almost entirely overlaps the bottom face of the element trench TR1 in plan layout. Similarly, the termination trench TR2 has the bottom face covered with the termination diffusion region 12. The termination diffusion region 12 almost entirely overlaps the bottom face of the termination trench TR2 in plan layout.

The protective diffusion region 11, however, does not have to be in contact with the bottom face of the element trench TR1 as long as the protective diffusion region 11 is at a deeper location than the element trench TR1. The protective diffusion region 11 does not have to overlap the bottom face of the element trench TR1 in plan layout. The termination diffusion region 12 also does not have to be in contact with the bottom face of the termination trench TR2 as long as the termination diffusion region 12 is at a deeper location than the termination trench TR2. The termination diffusion region 12 also does not have to overlap the bottom face of the termination trench TR2 in plan layout.

Although the active cell region 101 has a square shape, and the peripheral cell region 102 has a rectangular shape in the embodiment, the active cell region 101 and the peripheral cell region 102 may have other shapes. The shape of the gate electrode 7 in the element region 100 is thus not limited to the lattice shape (FIG. 2), and may be a striped shape, for example.

Figure 15:
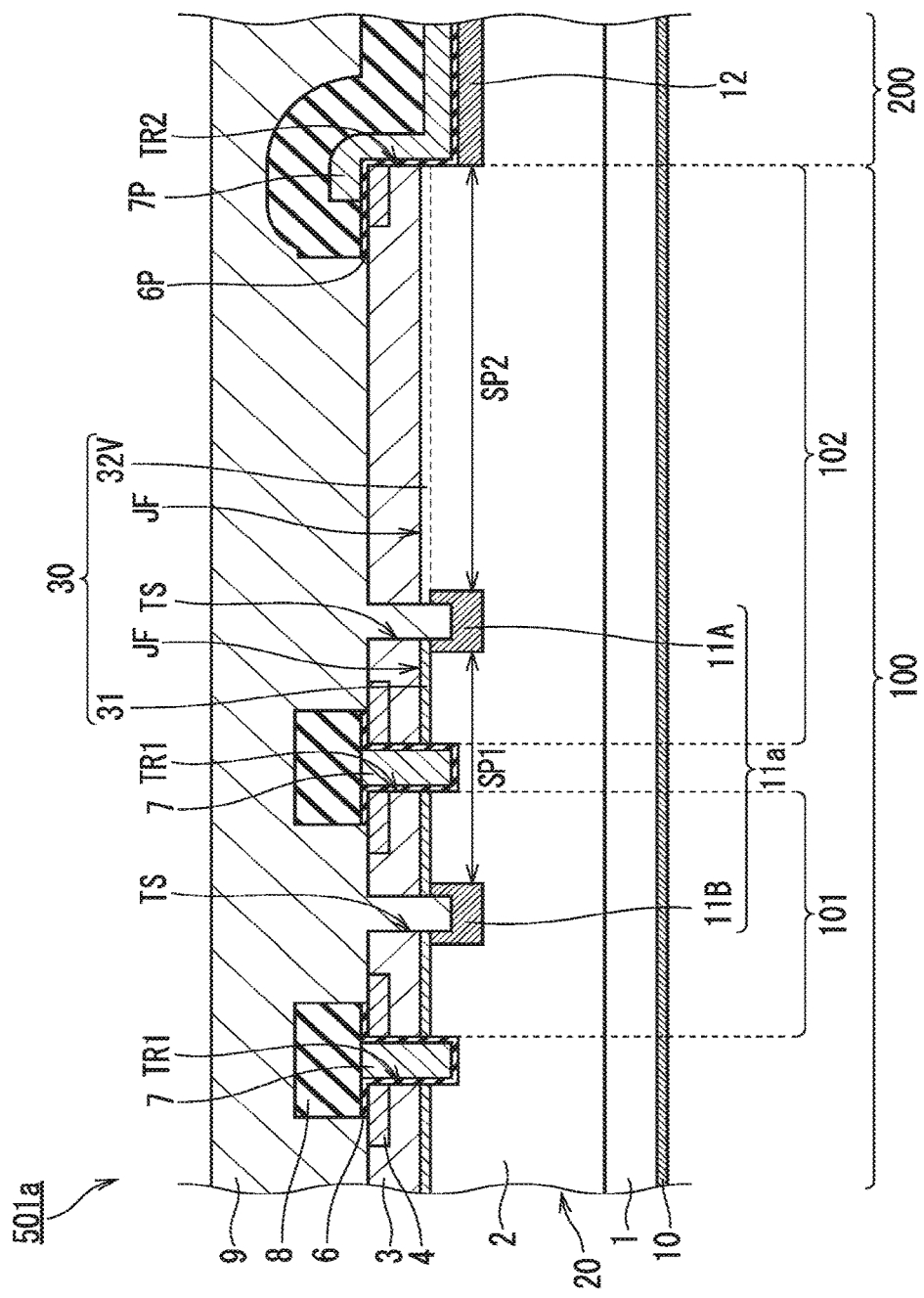
FIG. 15 is a sectional view showing a first modification of the power semiconductor device of FIG. 3.

Referring to FIG. 15, in a MOSFET 501a according to a first modification, a source trench TS distant from the source region 4 is provided in the epitaxial layer 20 in the active cell region 101 and the peripheral cell region 102. The source trench TS penetrates the p-base region 3 and the current diffusion layer 30 to reach the drift layer 2. The source trench TS is filled with the source electrode 9. The bottom face of the source trench TS is covered with a protective diffusion region 11a in the present modification.

Figure 16:
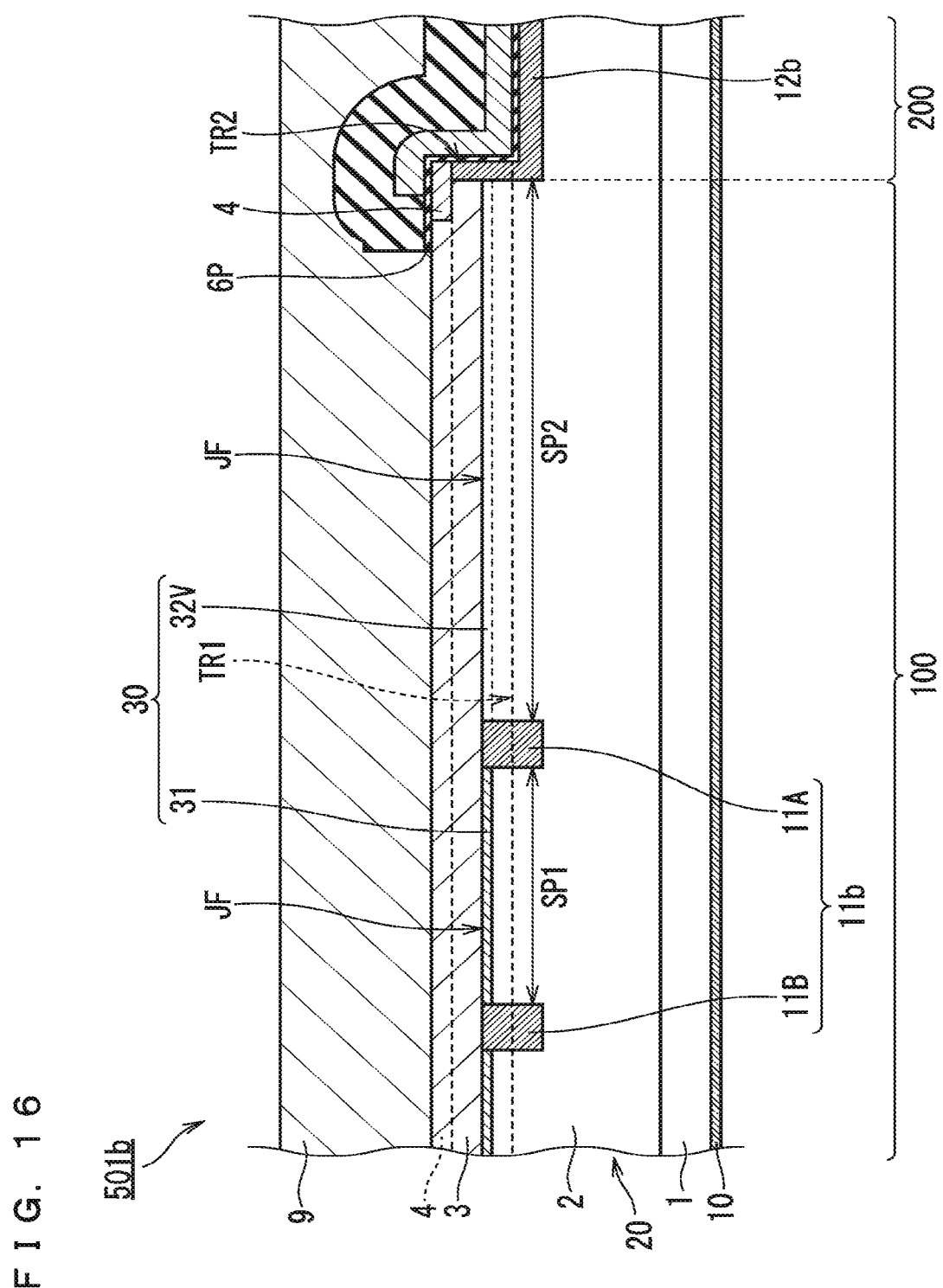
FIG. 16 is a sectional view showing a second modification of the power semiconductor device of FIG. 3.

FIG. 16 is a sectional view schematically showing the configuration of a MOSFET 501b according to a second modification. The MOSFET 501b is of a striped type, and thus the gate electrode 7 extends along a striped direction (lateral direction in FIG. 16) in the element region 100. A protective diffusion region 11b extends along a direction crossing the striped direction (direction perpendicular to the plane of FIG. 16) in the present modification. Not only the bottom face of the termination trench TR2 but also a part of the inner peripheral side face of the termination trench TR2 is covered with a termination diffusion region 12b. The termination diffusion region 12b thus extends from the termination region 200 into the element region 100. This means that the termination diffusion region 12b includes, in the element region 100, an intrusion portion intruding from the termination region 200 into the element region 100. In such a case, a space between the intrusion portion and the protective diffusion region 11b adjacent to the intrusion portion corresponds to the space SP2. The intrusion portion can be provided in embodiments other than the present modification.

Embodiment 2

Figure 17:
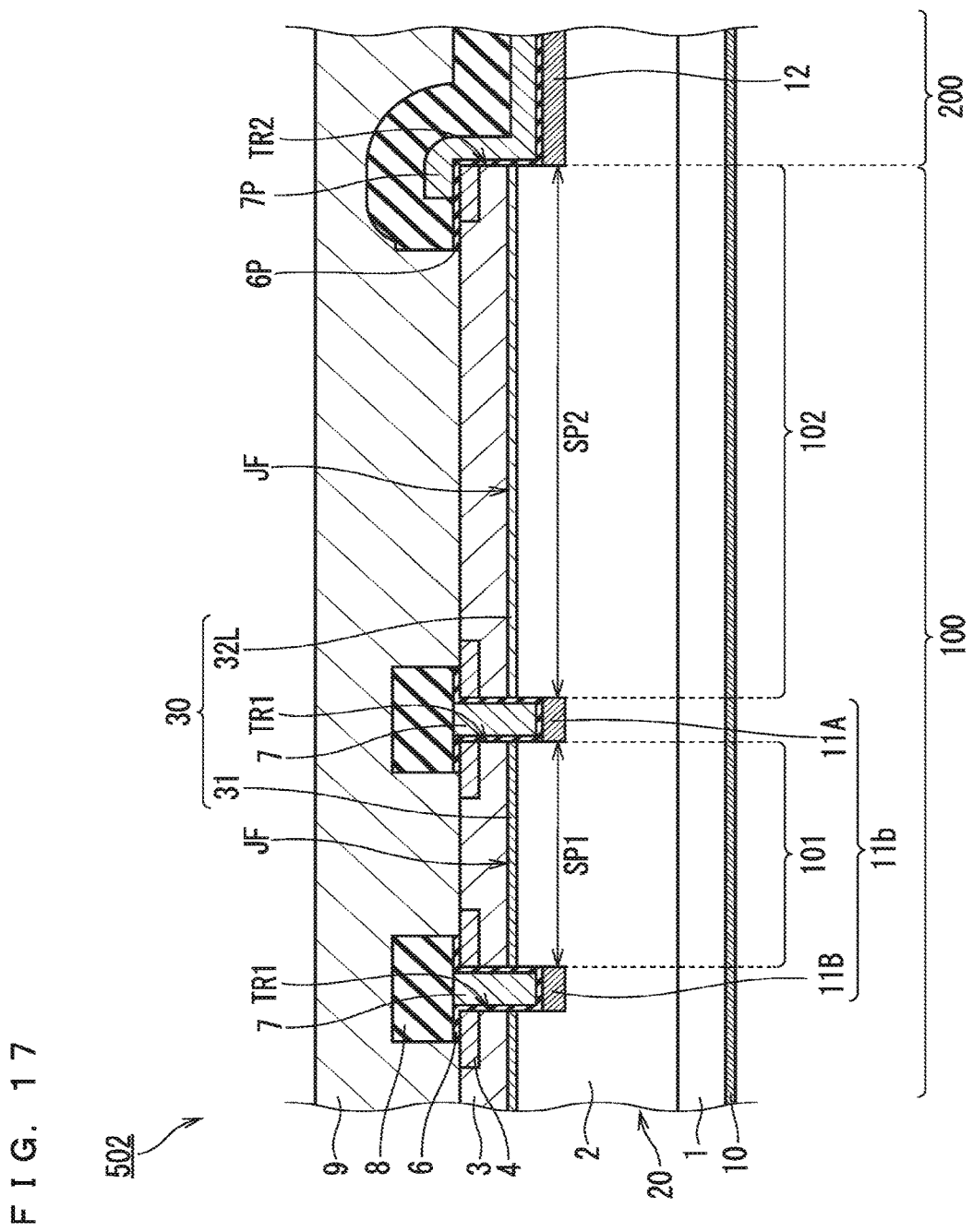
FIG. 17 is a sectional view schematically showing the configuration of a power semiconductor device according to Embodiment 2.

Referring to FIG. 17, a MOSFET 502 (power semiconductor device) according to the present embodiment includes a current diffusion layer 32L (second current diffusion layer) in place of the current diffusion layer 32V (FIG. 3: Embodiment 1). The current diffusion layer 32L has a lower impurity concentration than the current diffusion layer 31. This means that the current diffusion layer 32L as a whole has a lower impurity concentration than the current diffusion layer 31. The current diffusion layer 32L has a higher impurity concentration than the drift layer 2 at least on an upper face of the current diffusion layer 32L (on the pn-junction face JF). This means that the drift layer 2 and the current diffusion layer 32L have different impurity concentrations in the present embodiment. In this case, the boundary between the drift layer 2 and the current diffusion layer 32L is sometimes unclear, but the current diffusion layer 32L is defined as a region having the same thickness as the current diffusion layer 31 in the present description. The MOSFET 502 is thus configured so that a region (the current diffusion layer 32L) extending from a lower face of the p-base region 3 to have the same thickness as the current diffusion layer 31 has a lower impurity concentration than the current diffusion layer 31 and has a higher impurity concentration than the drift layer 2 between the protective diffusion region 11A and the termination diffusion region 12.

With the above-mentioned configuration, the impurity concentration on the pn-junction face JF of the current diffusion layer 30 is lower between the protective diffusion region 11A and the termination diffusion region 12 than between the protective diffusion regions 11A and 11B as in Embodiment 1.

The current diffusion layers 31 and 32L having different impurity concentrations can be obtained by forming the current diffusion layer 30 by ion implantation under different conditions in the active cell region 101 and in the peripheral cell region 102.

Components other than the above-mentioned component and a manufacturing method are approximately the same as those in Embodiment 1 described above, and thus the same or corresponding components bear the same reference signs, and description thereof is not repeated.

According to the present embodiment, the impurity concentration between the protective diffusion region 11A and the termination diffusion region 12 can finely be adjusted within a range between the impurity concentration of the drift layer 2 and the impurity concentration of the current diffusion layer 31. The difference between the breakdown voltage in the active cell region 101 and the breakdown voltage in the peripheral cell region 102 can thus be reduced.

Figure 18:
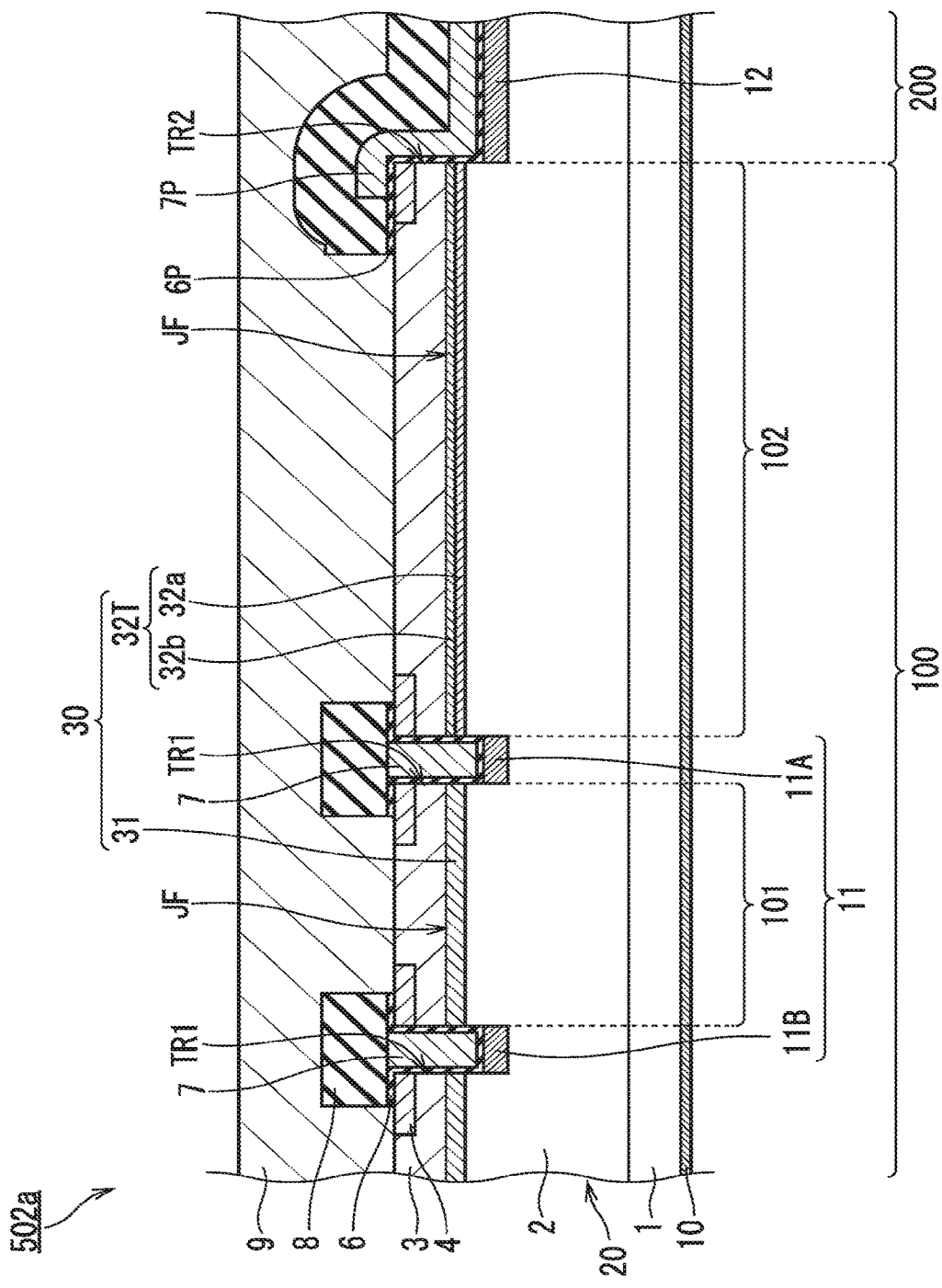
FIG. 18 is a sectional view showing a modification of the power semiconductor device of FIG. 17.

Referring to FIG. 18, a MOSFET 502a (power semiconductor device) according to a modification includes a current diffusion layer 32T (second current diffusion layer) in place of the current diffusion layer 32L (FIG. 17). The current diffusion layer 32T includes a region 32a and a region 32b. The region 32a is in contact with the drift layer 2, and is separated from the p-base region 3 by the region 32b. The region 32b is in contact with the p-base region 3, and is separated from the drift layer 2 by the region 32a. The region 32a has a lower impurity concentration than the current diffusion layer 31, and may have the same impurity concentration as the drift layer 2. The region 32b has a higher impurity concentration than the region 32a, and may have the same impurity concentration as the current diffusion layer 31. An effect approximately similar to the effect obtained in Embodiment 2 described above can be obtained in the present modification.

Embodiment 3

Figure 19:
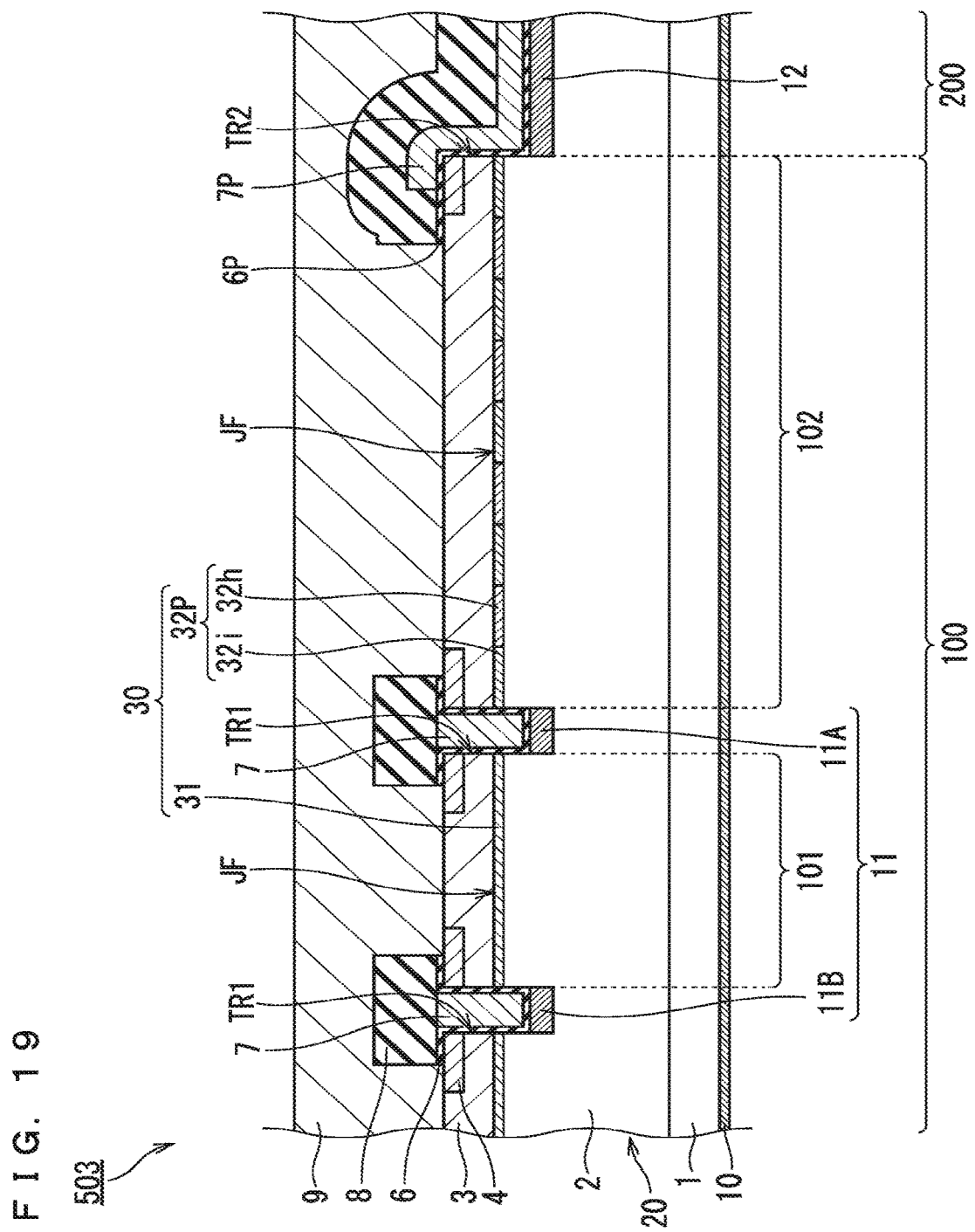
FIG. 19 is a sectional view schematically showing the configuration of a power semiconductor device according to Embodiment 3.

Referring to FIG. 19, a MOSFET 503 (power semiconductor device) according to the present embodiment includes a current diffusion layer 32P (second current diffusion layer) in place of the current diffusion layer 32V (FIG. 3: Embodiment 1). The current diffusion layer 32P includes a region 32h (first region) having a lower impurity concentration than the current diffusion layer 31 and a region 32i (second region) having a higher impurity concentration than the region 32h. Each of the regions 32h and 32i is in contact with the p-base region 3.

Specifically, the region 32h has the same impurity concentration as the drift layer 2. The region 32h is thus a region having a lower impurity concentration than the current diffusion layer 31. The region 32i has the same impurity concentration as the current diffusion layer 31.

With the above-mentioned configuration, the impurity concentration on the pn-junction face JF of the current diffusion layer 30 is partially lower between the protective diffusion region 11A and the termination diffusion region 12 than between the protective diffusion region 11A and the protective diffusion region 11B.

The current diffusion layer 30 in the present embodiment can be formed by changing a mask pattern used in the ion implantation process (see FIG. 7) described in Embodiment 1 without particularly increasing the number of times that implantation is performed.

Components other than the above-mentioned component and a manufacturing method are approximately the same as those in Embodiment 1 described above, and thus the same or corresponding components bear the same reference signs, and description thereof is not repeated.

According to the present embodiment, an effective impurity concentration between the protective diffusion region 11A and the termination diffusion region 12 can finely be adjusted by the ratio of the region 32h to the region 32i in the current diffusion layer 32P. The region 32h of the current diffusion layer 32P has the same impurity concentration as the drift layer 2. This can simplify the process of providing the region 32h on the drift layer 2. The region 32i of the current diffusion layer 32P has the same impurity concentration as the current diffusion layer 31. The current diffusion layer 32P can thus be formed at the same time as the current diffusion layer 31.

Embodiment 4

Figure 20:
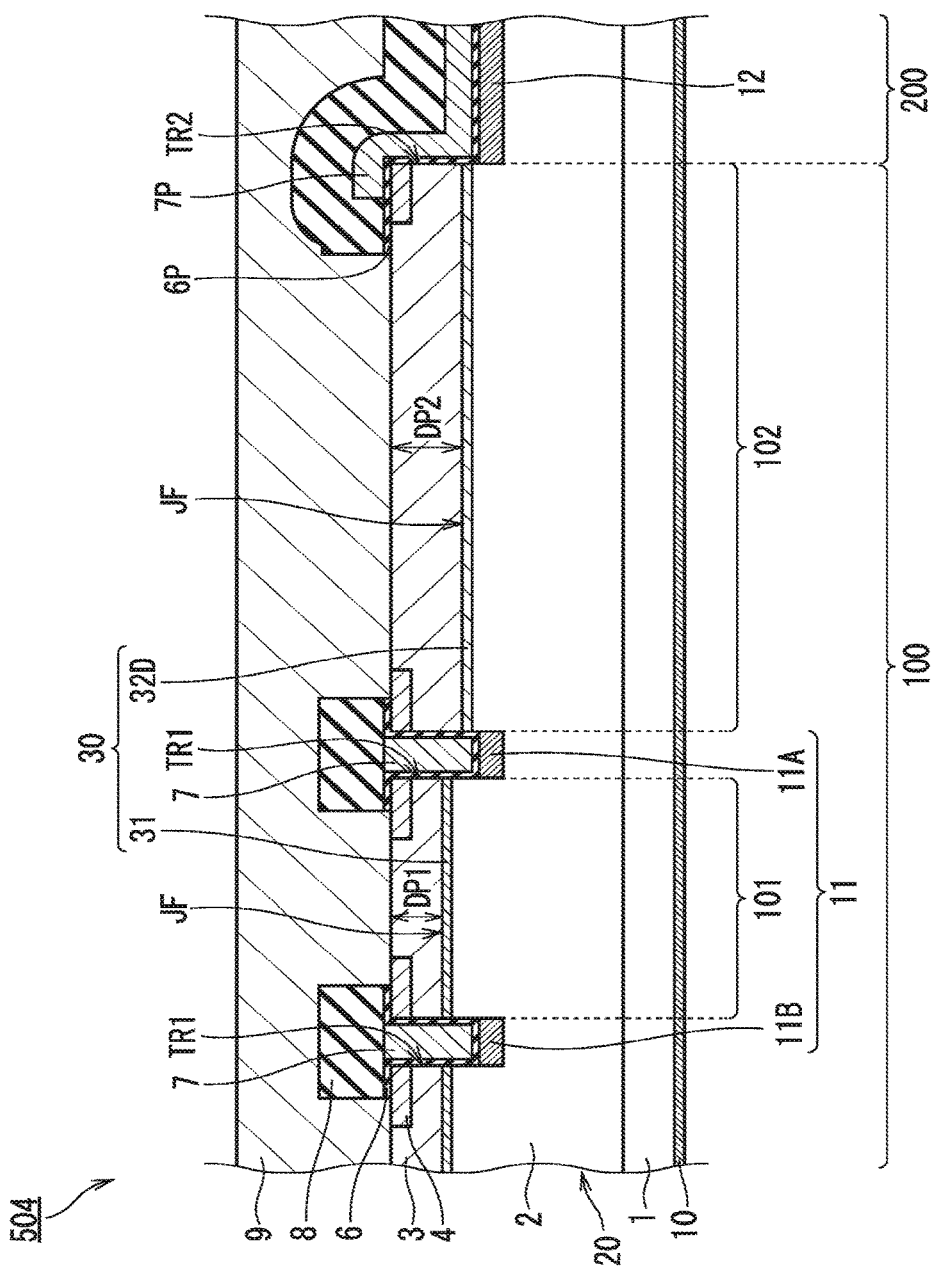
FIG. 20 is a sectional view schematically showing the configuration of a power semiconductor device according to Embodiment 4.

Referring to FIG. 20, a MOSFET 504 (power semiconductor device) according to the present embodiment includes a current diffusion layer 32D (second current diffusion layer) in place of the current diffusion layer 32V (FIG. 3: Embodiment 1). The current diffusion layer 32D is at a deeper location than the current diffusion layer 31. In other words, the current diffusion layer 32D as a whole is at a deeper location than the current diffusion layer 31. The pn-junction face JF is thus located at a depth DP1 between the protective diffusion regions 11A and 11B and at a depth DP2 between the protective diffusion region 11A and the termination diffusion region 12, and DP2>DP1 holds true.

The current diffusion layer 32D (second current diffusion layer) may have a lower impurity concentration than the current diffusion layer 31 (first current diffusion layer) in the present embodiment as in Embodiments 1 to 3. To meet this condition relating to the impurity concentration, the current diffusion layer 32D (second current diffusion layer) can have similar configuration to the current diffusion layer 32V, 32L, 32T, or 32P (FIG. 3, 17, 18, or 19) except for the features about the depth location. The current diffusion layer 32D may have the same impurity concentration as the current diffusion layer 31 in contrast to Embodiments 1 to 3. When the depths DP1 and DP2 have a large difference, the current diffusion layer 32D may sometimes have a higher impurity concentration than the current diffusion layer 31.

Components other than the above-mentioned component and a manufacturing method are approximately the same as those in Embodiment 1 described above, and thus the same or corresponding components bear the same reference signs, and description thereof is not repeated.

According to the present embodiment, the current diffusion layer 31 is at a shallower location than the current diffusion layer 32D located close to the termination region 200. Due to the presence of the current diffusion layer 31 being at a shallower location, a current effectively diffuses in the lateral direction in the portion of the element region 100 other than the portion close to the termination region 200 when the MOSFET 504 is on. As a result, a low on resistance can be obtained. On the other hand, when the MOSFET 504 is reverse biased, insufficient spread of the depletion layer from the pn-junction face JF to the drift layer 2 between the protective diffusion region 11A and the termination diffusion region 12 caused by the fact that the space SP2 (FIG. 3) between the protective diffusion region 11A and the termination diffusion region 12 is greater than the space SP1 (FIG. 3) between the protective diffusion regions 11A and 11B can be compensated for by the fact that the current diffusion layer 32D is at a deeper location than the current diffusion layer 31. Reduction in breakdown voltage caused by avalanche breakdown occurring between the protective diffusion region 11A and the termination diffusion region 12 is thus prevented. The MOSFET 504 having a low on-resistance and a high breakdown voltage can be obtained as described above.

Embodiment 5

Figure 21:
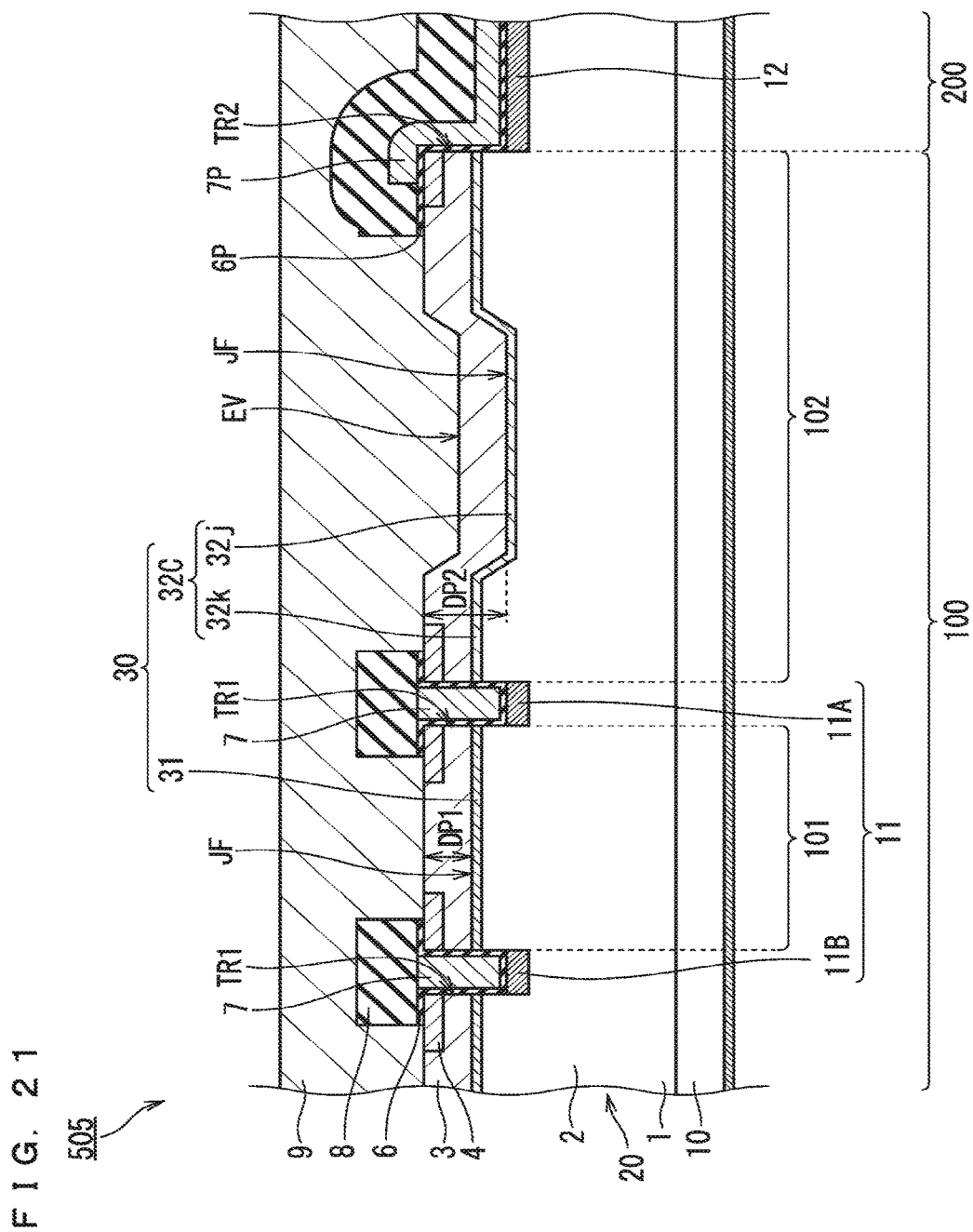
FIG. 21 is a sectional view schematically showing the configuration of a power semiconductor device according to Embodiment 5.

Referring to FIG. 21, a MOSFET 505 (power semiconductor device) according to the present embodiment includes a current diffusion layer 32C (second current diffusion layer) in place of the current diffusion layer 32D (FIG. 20: Embodiment 4). The current diffusion layer 32C includes a region 32j (first region) being at a deeper location than the current diffusion layer 31 and a region 32k (second region) being at a shallower location than the region 32j. The region 32k is at the same depth location as the current diffusion layer 31 in the present embodiment.

As the region 32j is at a deeper location than the region 32k, the pn-junction face JF of the current diffusion layer 32C has a recess. A portion of the epitaxial layer 20 on the current diffusion layer 32C is located along the recess. The epitaxial layer 20 thus has a recess EV above the region 32j. The pn-junction face JF is located at the depth DP1 between the protective diffusion regions 11A and 11B, and is partially located at the depth DP2 between the protective diffusion region 11A and the termination diffusion region 12 from a reference surface that is the surface of the epitaxial layer 20 outside the recess EV. Herein, DP2>DP1 holds true.

To locate the regions 32k and 32j at different depths, the recess EV (FIG. 21) is formed in the epitaxial layer 20 before ion implantation for forming the current diffusion layer 30 and the p-base region 3 in the ion implantation process (see FIG. 7). Ions incident on the recess EV intrude deeper into the epitaxial layer 20, and, as a result, the region 32j is formed at a deeper location than the region 32k. The source region 4 may be formed either before or after formation of the recess EV.

Components other than the above-mentioned component and a manufacturing method are approximately the same as those in Embodiment 4 described above, and thus the same or corresponding components bear the same reference signs, and description thereof is not repeated.

According to the present embodiment, the current diffusion layer 30 is provided in the epitaxial layer 20 having the recess EV, so that a part of the current diffusion layer 30 can selectively be formed at a deeper location without changing energy used in ion implantation. The current diffusion layer 30 can thus easily include the region 32j being at a deeper location between the protective diffusion region 11A and the termination diffusion region 12.

Embodiment 6

Figure 22:
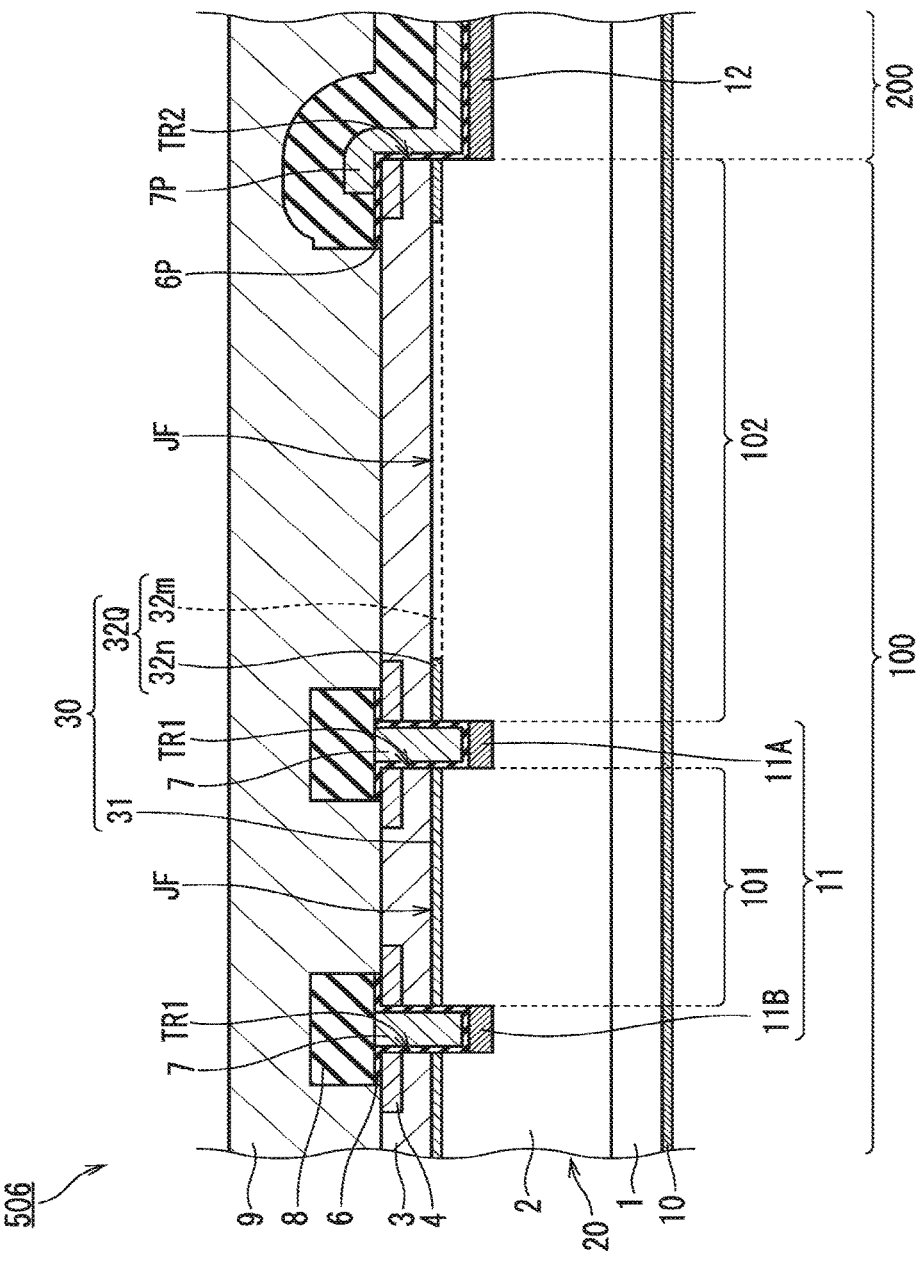
FIG. 22 is a sectional view schematically showing the configuration of a power semiconductor device according to Embodiment 6.
Figure 23:
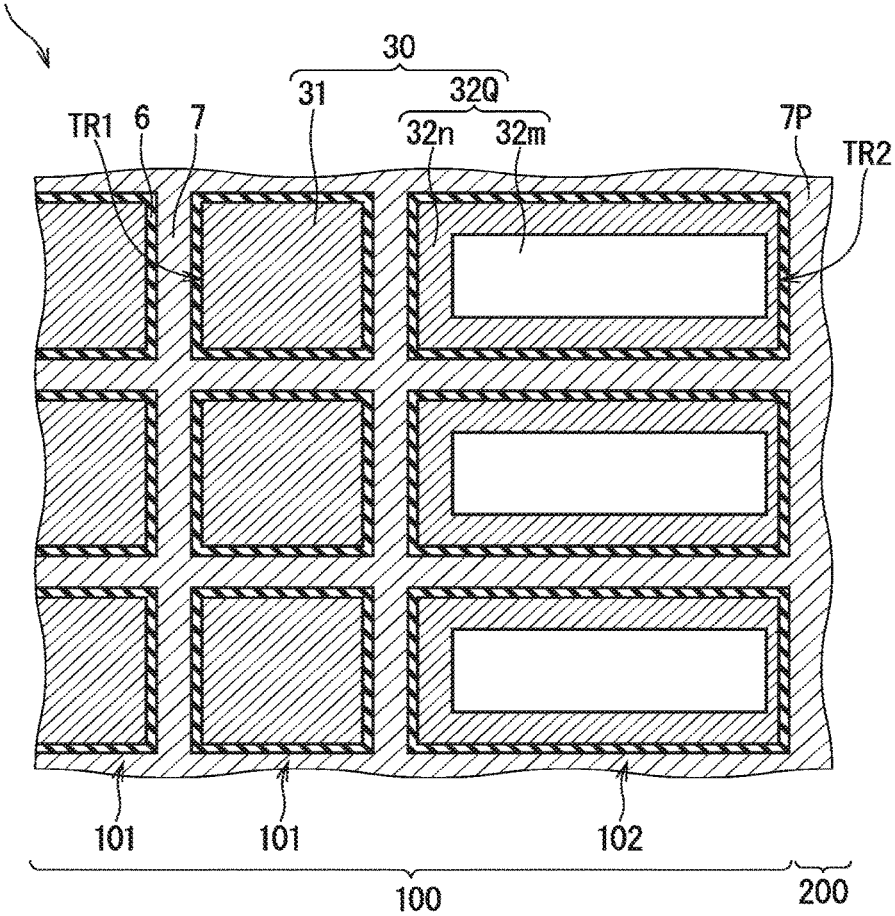
FIG. 23 is a sectional view of the power semiconductor device of FIG. 22 at a depth location of a current diffusion layer.

FIGS. 22 and 23 are sectional views schematically showing the configuration of a MOSFET 506 (power semiconductor device) according to the present embodiment. A cross section of FIG. 22 corresponds to a cross section of FIG. 3 or the like. A cross section of FIG. 23 is a cross section orthogonal to the cross section of FIG. 22 at a depth location of the current diffusion layer 30.

The MOSFET 506 includes a current diffusion layer 32Q (second current diffusion layer) in place of the current diffusion layer 32V (FIG. 3: Embodiment 1). The current diffusion layer 32Q has the same thickness as the current diffusion layer 31. The current diffusion layer 32Q includes a region 32m (first region) and a region 32n (second region). The region 32m has the same impurity concentration as the drift layer 2. The region 32n has the same impurity concentration as the current diffusion layer 31. The region 32n thus has a higher impurity concentration than the region 32m.

Each of the regions 32m and 32n is in contact with the p-base region 3. The region 32n is in contact with the gate insulating film 6. In other words, the region 32n is distributed along the peripheries of the element trench TR1 and the termination trench TR2. A portion of the current diffusion layer 32Q other than the region 32n corresponds to the region 32m.

As the region 32m (indicated in a broken line in FIG. 22) has an equal impurity concentration to the drift layer 2, the boundary between the region 32m and the drift layer 2 is an imaginary boundary. The region 32m is defined by an imaginary region located under the p-base region 3 and having the same thickness as the current diffusion layer 31. When the configuration of the present embodiment is described more directly from another perspective without defining the region 32m, no current diffusion layer having a higher impurity concentration than the drift layer 2 is provided outside the region 32n between the protective diffusion region 11A and the terminal diffusion region 12 so that the drift layer 2 and the p-base region 3 are in direct contact with each other outside the region 32n between the protective diffusion region 11A and the terminal diffusion region 12.

The current diffusion layer 30 in the present embodiment can be formed by changing the mask pattern used in the ion implantation process (see FIG. 7) described in Embodiment 1 without particularly increasing the number of times that implantation is performed.

Components other than the above-mentioned component and a manufacturing method are approximately the same as those in Embodiment 1 described above, and thus the same or corresponding components bear the same reference signs, and description thereof is not repeated.

According to the present embodiment, the region 32n is provided to be in contact with the gate insulating film 6. This means that, in the peripheral cell region 102, the region 32n is provided at a location that serves as a current path in an on-state. The region 32n has the same impurity concentration as the current diffusion layer 31. The on-resistance can thus be approximately similar in the peripheral cell region 102 and in the active cell region 101. An increase in on-resistance caused by the region 32m, which is a region in which substantially no current diffusion layer is provided, can thus be suppressed while providing the region 32m. This means that a lower on-resistance than that obtained in the MOSFET 501 (FIG. 3: Embodiment 1) can be obtained.

On the other hand, the region 32m, which is the region in which substantially no current diffusion layer is provided, can compensate for insufficient spread of the depletion layer from the pn-junction face JF to the drift layer 2 between the protective diffusion region 11A and the termination diffusion region 12 when the MOSFET 506 is reverse biased. Reduction in breakdown voltage caused by avalanche breakdown occurring between the protective diffusion region 11A and the termination diffusion region 12 is thus prevented.

As a modification, the region 32m may have a higher impurity concentration than the drift layer 2 while having a lower impurity concentration than the region 32n. According to the present modification, as the region 32m has a higher impurity concentration than the drift layer 2, the on-resistance can further be reduced. The effect of compensating for insufficient spread of the depletion layer can sufficiently be obtained unless the region 32m has an excessively high impurity concentration. In this modification, the ion implantation process for forming the region 32m is performed in contrast to the embodiment described above.

Embodiment 7

Figure 24:
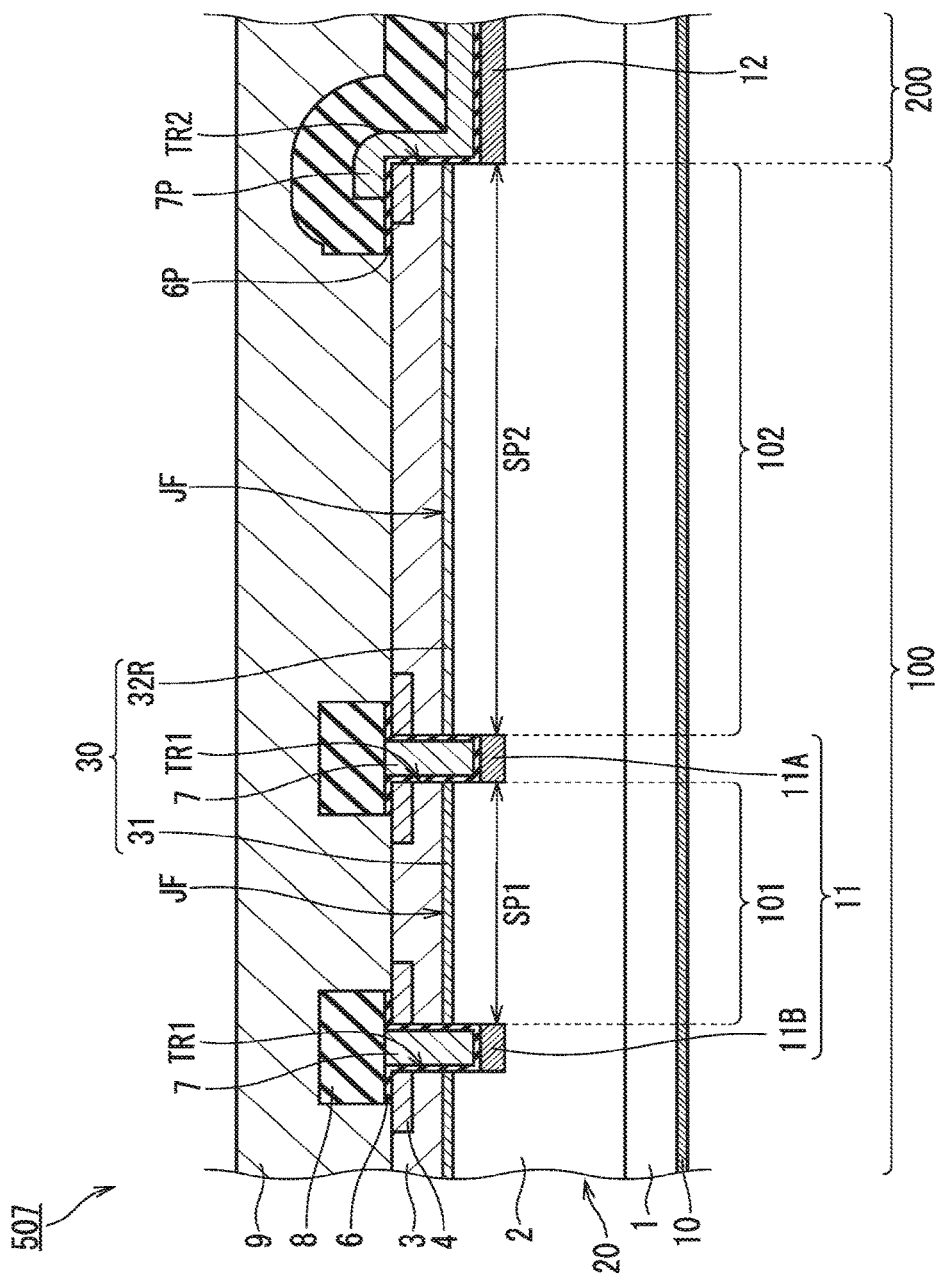
FIG. 24 is a sectional view schematically showing the configuration of a power semiconductor device according to Embodiment 7.
Figure 25:
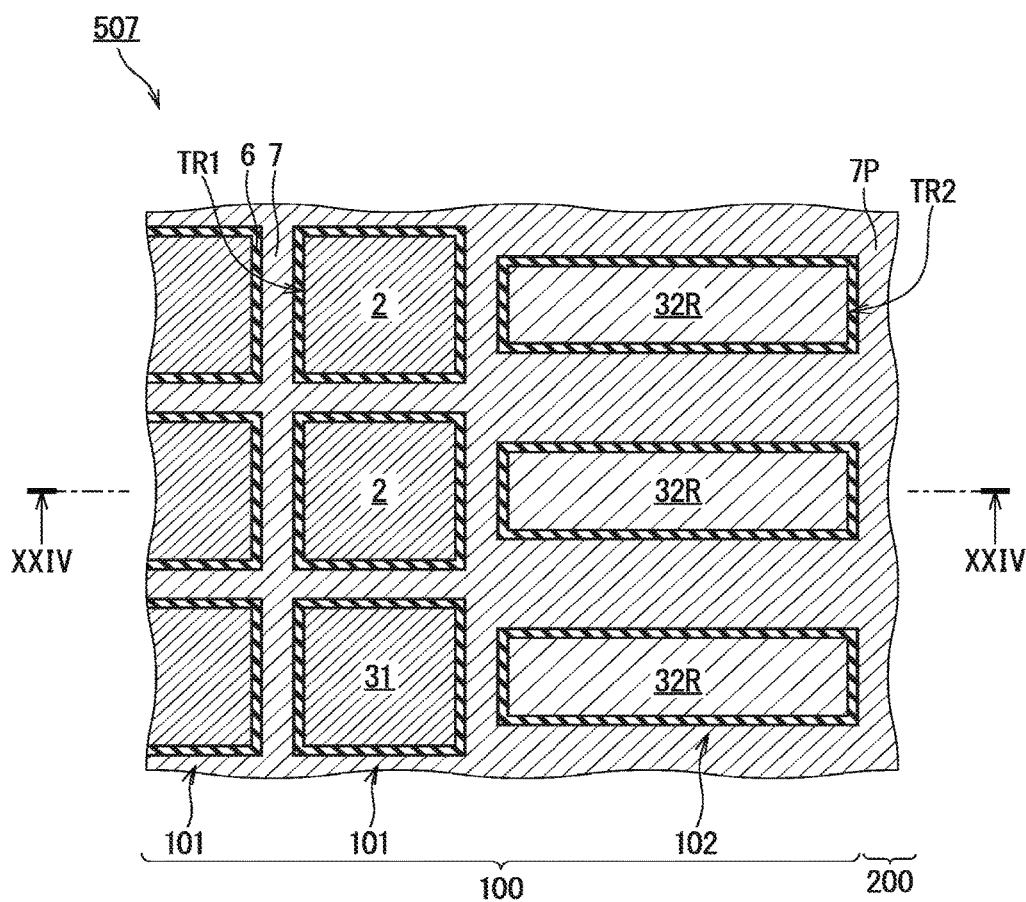
FIG. 25 is a sectional view of the power semiconductor device of FIG. 24 at a depth location of a current diffusion layer.

FIG. 24 is a sectional view schematically showing the configuration of a MOSFET 507 (power semiconductor device) according to the present embodiment. A cross section of FIG. 24 corresponds to the cross section of FIG. 3 or the like, and is taken along the line XXIV-XXIV of FIGS. 25 and 26. FIG. 25 illustrates a cross section orthogonal to the cross section of FIG. 24 at a depth location of the current diffusion layer 30, and FIG. 26 illustrates a cross section orthogonal to the cross section of FIG. 24 at a depth location of the protective diffusion region 11.

The MOSFET 507 includes a current diffusion layer 32R (second current diffusion layer) in place of the current diffusion layer 32V (FIG. 3: Embodiment 1). The current diffusion layer 32R has the same impurity concentration as the current diffusion layer 31. The current diffusion layer 32R also has the same thickness as the current diffusion layer 31. The current diffusion layer 30 including the current diffusion layers 31 and 32R is thus uniform in an in-plane direction in the present embodiment.

Figure 26:
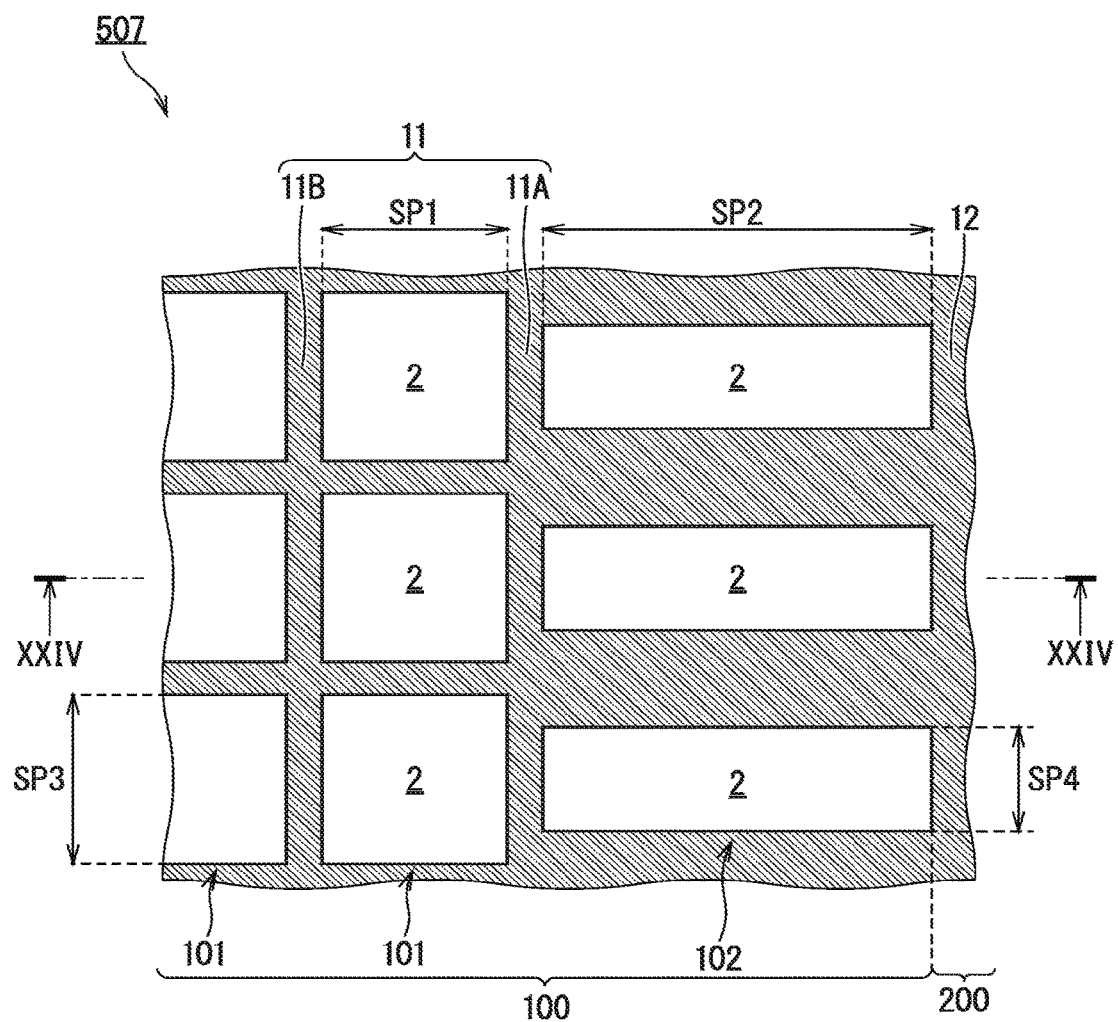
FIG. 26 is a sectional view of the power semiconductor device of FIG. 24 at a depth location of a protective diffusion region.

Referring to FIG. 26, the protective diffusion region 11 includes portions sandwiching, in a direction orthogonal to the space SP1 (in the vertical direction in FIG. 26), a region in which the space SP1 is provided, and being located with a space SP3 (third space) therebetween in the present embodiment. The protective diffusion region 11 also includes portions sandwiching, in a direction orthogonal to the space SP2 (in the vertical direction in FIG. 26), a region in which the space SP2 is provided, and being located with a space SP4 (fourth space) therebetween. The space SP4 is smaller than the space SP3.

The current diffusion layer 30 is uniform in the in-plane direction in the present embodiment. This eliminates the need for impurity concentration distribution within the current diffusion layer 30. The mask pattern is thus unnecessary in the ion implantation process (see FIG. 7) for forming the current diffusion layer 30. The mask pattern is also unnecessary in the ion implantation process for forming the p-base region 3, and thus these processes can be performed continuously. This can reduce the manufacturing process.

Components other than the above-mentioned components and a manufacturing method are approximately the same as those in Embodiment 1 described above, and thus the same or corresponding components bear the same reference signs, and description thereof is not repeated.

According to the present embodiment, a low on-resistance can be obtained by providing the current diffusion layer 30. Specifically, the current diffusion layer 30 is provided in the entire region including the active cell region 101 and the peripheral cell region 102 to be uniform. The current diffusion layer 30 thus has the effect of suppressing the on-resistance in the peripheral cell region 102 as in the active cell region 101.

On the other hand, the space SP4 smaller than the space SP3 can compensate for insufficient spread of the depletion layer caused by the fact that the space SP2 is greater than the space SP1 when the MOSFET 507 is reverse biased. In other words, the spread of the depletion layer along the space SP4 can compensate for insufficient spread of the depletion layer along the space SP2. Reduction in breakdown voltage caused by avalanche breakdown occurring between the protective diffusion region 11A and the termination diffusion region 12 is thus prevented.

As modifications, the current diffusion layer 32C, 32D, 32L, 32P, 32Q, 32T, 32V, and the like described in Embodiments 1 to 6 may be applied in place of the current diffusion layer 32R. Each of the on-resistance and the breakdown voltage can thus be adjusted more freely. In this modification, the mask pattern is used in the ion implantation process for forming the current diffusion layer 30 in contrast to the above-mentioned embodiment.

Embodiments of the present invention can freely be combined with each other, and can be modified or omitted as appropriate within the scope of the invention. For example, in addition to SiC, a gallium nitride (GaN) material or diamond can be used as the wide bandgap semiconductor. Another conductive substrate may be used in place of the SiC substrate 1. The substrate is preferably suitable for epitaxial growth of the above-mentioned wide bandgap semiconductor, and is, for example, made from a similar wide bandgap semiconductor. An insulating film other than an oxide film may be used as the gate insulating film of the MOSFET. This means that the power semiconductor device may be a metal insulator semiconductor field effect transistor (MISFET) other than a MOSFET. The power semiconductor device is not limited to a MISFET, and may be an IGBT, for example. The IGBT is obtained by setting the conductivity type of the substrate to the second conductivity type, or providing a collector layer of the second conductivity type between the substrate and a second electrode. In this case, a first electrode and the second electrode respectively function as an emitter electrode and a collector electrode of the IGBT. The first conductivity type may be the p-type, and the second conductivity type may be the n-type. In this case, the donor is replaced with an acceptor, and the acceptor is replaced with a donor in the above-mentioned description.

While the invention has been described in detail, the foregoing description is in all aspects illustrative and not restrictive. It is therefore understood that numerous modifications not having been described as examples can be devised without departing from the scope of the invention.

EXPLANATION OF REFERENCE SIGNS

JF pn-junction face, SP1 first space, SP2 second space, SP3 third space, SP4 fourth space, TR1 element trench, TS source trench, TR2 termination trench, 1 SiC substrate, 2 drift layer, 3 p-base region, 4 source region, 6 gate insulating film, 6A silicon oxide film (insulating film), 7 gate electrode, 7A polysilicon film (conductive film), 7P gate extraction electrode, 8 interlayer insulating film, 9 source electrode, 10 drain electrode, 11, 11a, 11b protective diffusion region, 11A first protective diffusion region, 11B second protective diffusion region, 12, 12b termination diffusion region, 13 hard mask, 14 resist mask, 15 silicon oxide film, 16 implantation mask, 17 contact hole, 19 etching mask, 20 epitaxial layer, 30 current diffusion layer, 31 first current diffusion layer, 32C, 32D, 32L, 32P, 32Q, 32T, 32V second current diffusion layer, 37 gate pad, 100 element region, 101 active cell region, 102 peripheral cell region, 200 termination region, 501 to 507, 501a, 501b, 502a MOSFET (power semiconductor device).

The invention claimed is:

1. A power semiconductor device comprising:
a drift layer of a first conductivity type made from a wide bandgap semiconductor;
a base region of a second conductivity type formed over said drift layer in an element region;
a source region of said first conductivity type formed on said base region;
a gate insulating film formed on a side face and a bottom face of an element trench, said element trench penetrating said base region and said source region to reach said drift layer;
a gate electrode formed inside said element trench with said gate insulating film therebetween;
a protective diffusion region of said second conductivity type formed at a deeper location in said drift layer than said element trench in said element region;
a current diffusion layer of said first conductivity type formed under said base region;
a gate extraction electrode formed, in a termination region surrounding said element region, in a termination trench with an insulating film therebetween, and electrically connected to said gate electrode, said termination trench having a side face being in contact with said base region; and
a termination diffusion region of said second conductivity type formed at a deeper location than said termination trench in said termination region, wherein
in a sectional view,
said protective diffusion region includes a first protective diffusion region and a second protective diffusion region, said first protective diffusion region being in said element region at a location closest to said termination region, said second protective diffusion region being located away from said first protective diffusion region with a first space therebetween,
a second space that is a distance between said termination diffusion region and said first protective diffusion region is greater than said first space,
said current diffusion layer includes a first current diffusion layer and a second current diffusion layer, said first current diffusion layer being located between said first protective diffusion region and said second protective diffusion region and having a higher impurity concentration than said drift layer, said second current diffusion layer being located between said first protective diffusion region and said termination diffusion region, and said second current diffusion layer includes a region having a lower impurity concentration than said first current diffusion layer.

2. The power semiconductor device according to claim 1, wherein
said second current diffusion layer has the same impurity concentration as said drift layer.

3. The power semiconductor device according to claim 1, wherein
said second current diffusion layer has a higher impurity concentration than said drift layer.

4. The power semiconductor device according to claim 1, wherein
said second current diffusion layer includes a first region having a lower impurity concentration than said first current diffusion layer and a second region having a higher impurity concentration than said first region.

5. The power semiconductor device according to claim 4, wherein
said first region has the same impurity concentration as said drift layer.

6. The power semiconductor device according to claim 4, wherein
said second region has the same impurity concentration as said first current diffusion layer.

7. The power semiconductor device according to claim 4, wherein
said second region has the same impurity concentration as said first current diffusion layer, and is in contact with said gate insulating film.

8. The power semiconductor device according to claim 1, wherein
said second current diffusion layer has the same thickness as said first current diffusion layer.

9. A power semiconductor device comprising:
a drift layer of a first conductivity type made from a wide bandgap semiconductor;
a base region of a second conductivity type formed over said drift layer in an element region;
a source region of said first conductivity type formed on said base region;
a gate insulating film formed on a side face and a bottom face of an element trench, said element trench penetrating said base region and said source region to reach said drift layer;
a gate electrode formed inside said element trench with said gate insulating film therebetween;
a protective diffusion region of said second conductivity type formed at a deeper location in said drift layer than said element trench in said element region;
a current diffusion layer of said first conductivity type formed under said base region;
a gate extraction electrode formed, in a termination region surrounding said element region, in a termination trench with an insulating film therebetween, and electrically connected to said gate electrode, said termination trench having a side face being in contact with said base region; and
a termination diffusion region of said second conductivity type formed at a deeper location than said termination trench in said termination region, wherein
in a sectional view,
said protective diffusion region includes a first protective diffusion region and a second protective diffusion region, said first protective diffusion region being in said element region at a location closest to said termination region, said second protective diffusion region being located away from said first protective diffusion region with a first space therebetween, a second space that is a distance between said termination diffusion region and said first protective diffusion region is greater than said first space, said current diffusion layer is located between said first protective diffusion region and said second protective diffusion region, and has a higher impurity concentration than said drift layer, and said drift layer and said base region are in direct contact with each other between said first protective diffusion region and said termination diffusion region in said sectional view.

10. A power semiconductor device comprising:
a drift layer of a first conductivity type made from a wide bandgap semiconductor;
a base region of a second conductivity type formed over said drift layer in an element region;
a source region of said first conductivity type formed on said base region;
a gate insulating film formed on a side face and a bottom face of an element trench, said element trench penetrating said base region and said source region to reach said drift layer;
a gate electrode formed inside said element trench with said gate insulating film therebetween;
a protective diffusion region of said second conductivity type formed at a deeper location in said drift layer than said element trench in said element region;
a current diffusion layer of said first conductivity type formed under said base region;
a gate extraction electrode formed, in a termination region surrounding said element region, in a termination trench with an insulating film therebetween, and electrically connected to said gate electrode, said termination trench having a side face being in contact with said base region; and
a termination diffusion region of said second conductivity type formed at a deeper location than said termination trench in said termination region, wherein in a sectional view, said protective diffusion region includes a first protective diffusion region and a second protective diffusion region, said first protective diffusion region being in said element region at a location closest to said termination region, said second protective diffusion region being located away from said first protective diffusion region with a first space therebetween, a second space that is a distance between said termination diffusion region and said first protective diffusion region is greater than said first space, said current diffusion layer includes a first current diffusion layer and a second current diffusion layer, said first current diffusion layer being located between said first protective diffusion region and said second protective diffusion region and having a higher impurity concentration than said drift layer, said second current diffusion layer being located between said first protective diffusion region and said termination diffusion region and having the same thickness as the first current diffusion layer, and said second current diffusion layer includes a region being at a deeper location than said first current diffusion layer.

11. The power semiconductor device according to claim 10, wherein said second current diffusion layer includes a first region being at a deeper location than said first current diffusion layer and a second region being at a shallower location than said first region.

* * * * *